(12) United States Patent
Fraser et al.

(10) Patent No.: US 8,863,661 B2
(45) Date of Patent: Oct. 21, 2014

(54) SYSTEM AND METHOD FOR LAYER-TO-LAYER COMPENSATION AND ERROR CORRECTION

(75) Inventors: John W. Fraser, Dayton, OH (US); Jeffrey William Hemmelgarn, Kettering, OH (US); Eric J. Serenius, Springboro, OH (US)

(73) Assignee: Ohio Gravure Technologies, Inc., Miamisburg, OH (US)

(*) Notice: Subject to any disclaimer, the term of this patent is extended or adjusted under 35 U.S.C. 154(b) by 594 days.

(21) Appl. No.: 13/046,145

(22) Filed: Mar. 11, 2011

(65) Prior Publication Data

US 2012/0227599 A1  Sep. 13, 2012

(51) Int. Cl.
| | |
|---|---|
| *B41F 1/00* | (2006.01) |
| *B41F 9/00* | (2006.01) |
| *B41F 13/14* | (2006.01) |
| *H05K 3/46* | (2006.01) |
| *H05K 3/12* | (2006.01) |

(52) U.S. Cl.
CPC ............ *B41F 9/00* (2013.01); *H05K 5/4664* (2013.01); *H05K 2201/09918* (2013.01); *H05K 3/1275* (2013.01); *B41F 13/14* (2013.01); *H05K 2203/166* (2013.01); *H05K 3/4679* (2013.01)

USPC ................ 101/291; 101/292; 101/298

(58) Field of Classification Search
USPC ...................... 101/287, 291, 292, 298
See application file for complete search history.

(56) References Cited

U.S. PATENT DOCUMENTS

| | | | |
|---|---|---|---|
| 5,112,171 A | 5/1992 | Daetwyler | |
| 5,158,018 A * | 10/1992 | Masaki et al. | 101/158 |
| 5,329,215 A | 7/1994 | Fraser et al. | |
| 5,367,953 A * | 11/1994 | Yamashita et al. | 101/158 |
| 5,582,104 A * | 12/1996 | Best et al. | 101/126 |
| 6,269,718 B1 | 8/2001 | Fraser et al. | |
| 6,348,979 B1 | 2/2002 | Flannery et al. | |
| 6,362,899 B1 | 3/2002 | Flannery et al. | |
| 6,433,890 B1 | 8/2002 | Beckett et al. | |
| 6,515,772 B1 | 2/2003 | Holowko et al. | |
| 6,525,839 B1 | 2/2003 | Beckett et al. | |
| 6,614,558 B1 | 9/2003 | Christopher et al. | |
| 7,661,358 B2 | 2/2010 | Kim et al. | |
| 7,715,058 B2 | 5/2010 | Fraser et al. | |
| 2008/0202366 A1 * | 8/2008 | Nagata | 101/316 |

* cited by examiner

*Primary Examiner* — David Banh
(74) *Attorney, Agent, or Firm* — Jacox, Meckstroth & Jenkins

(57) ABSTRACT

A system and method for reducing and/or eliminating the printed layer-over-layer registration error.

46 Claims, 17 Drawing Sheets

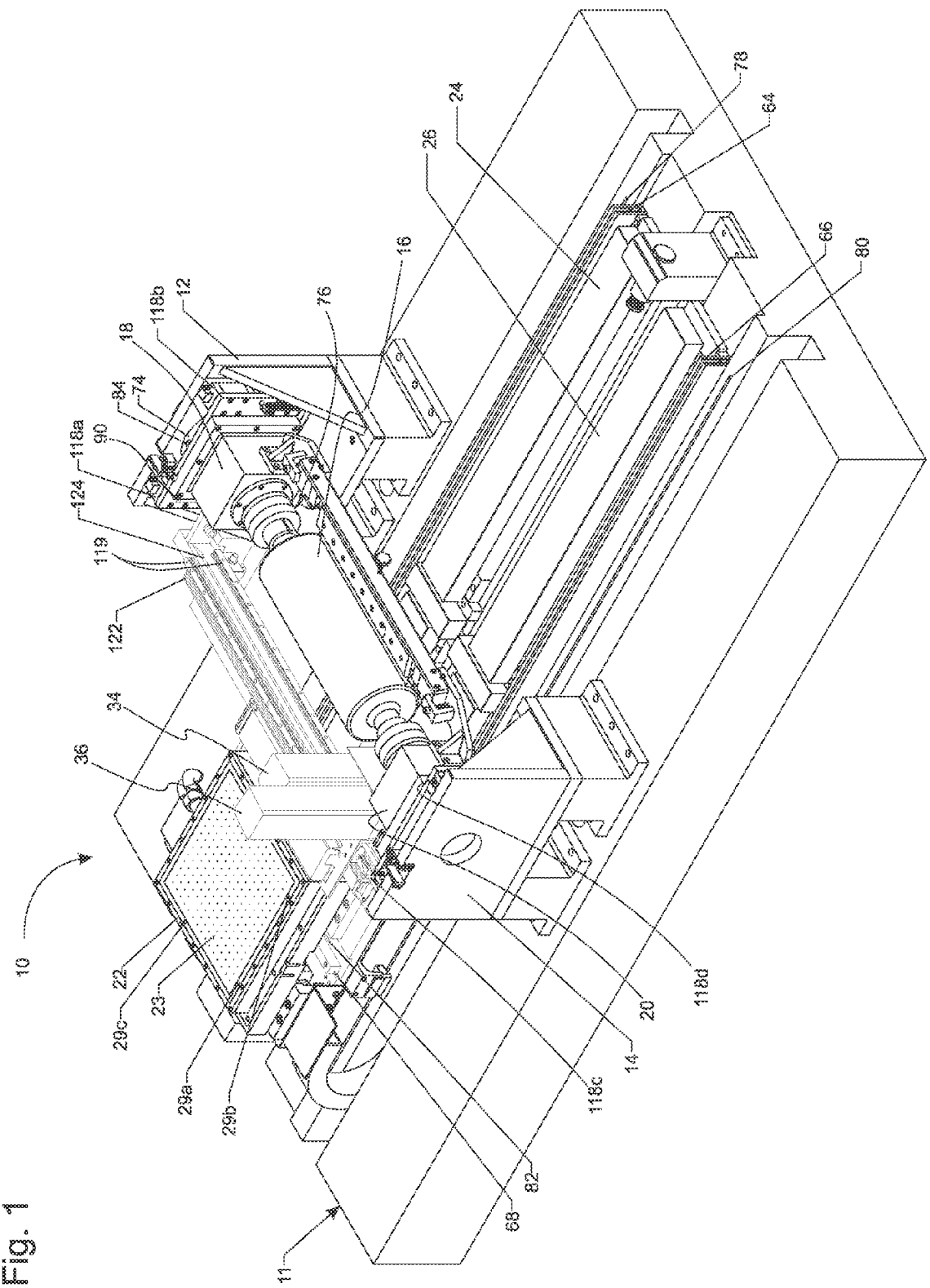

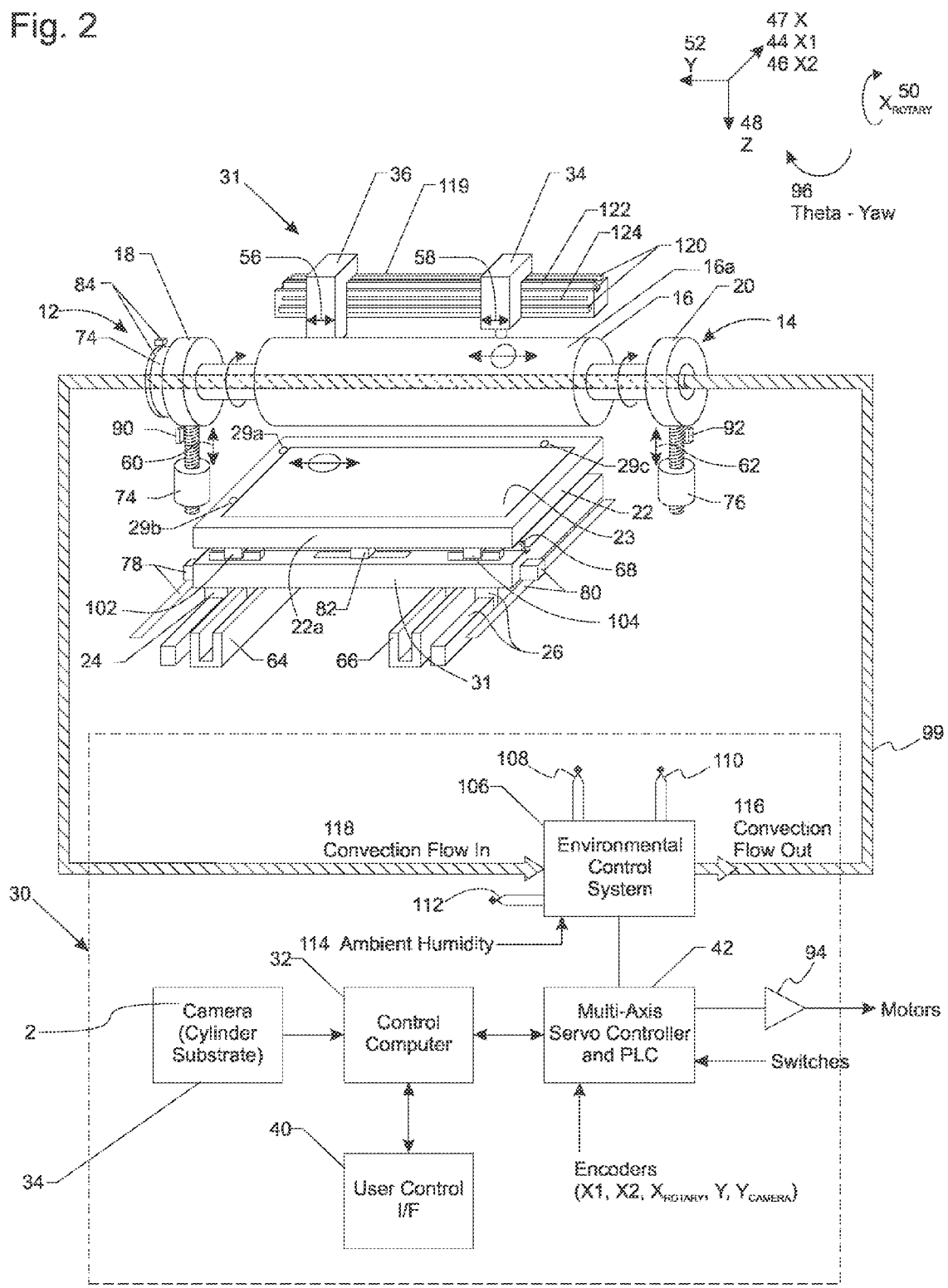

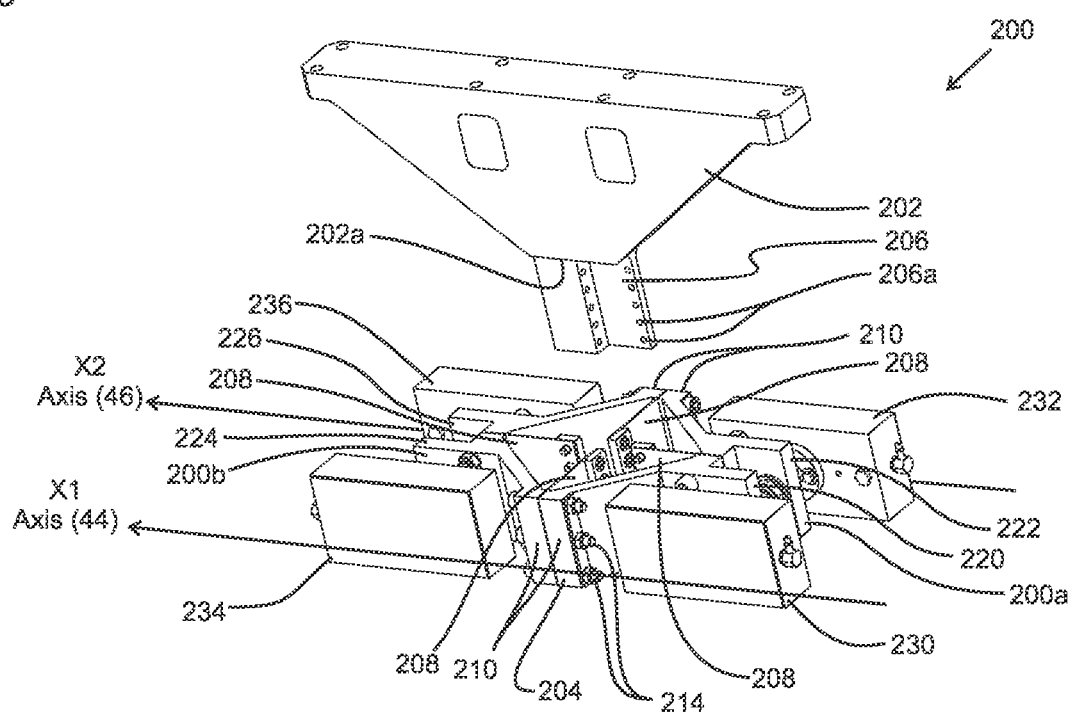

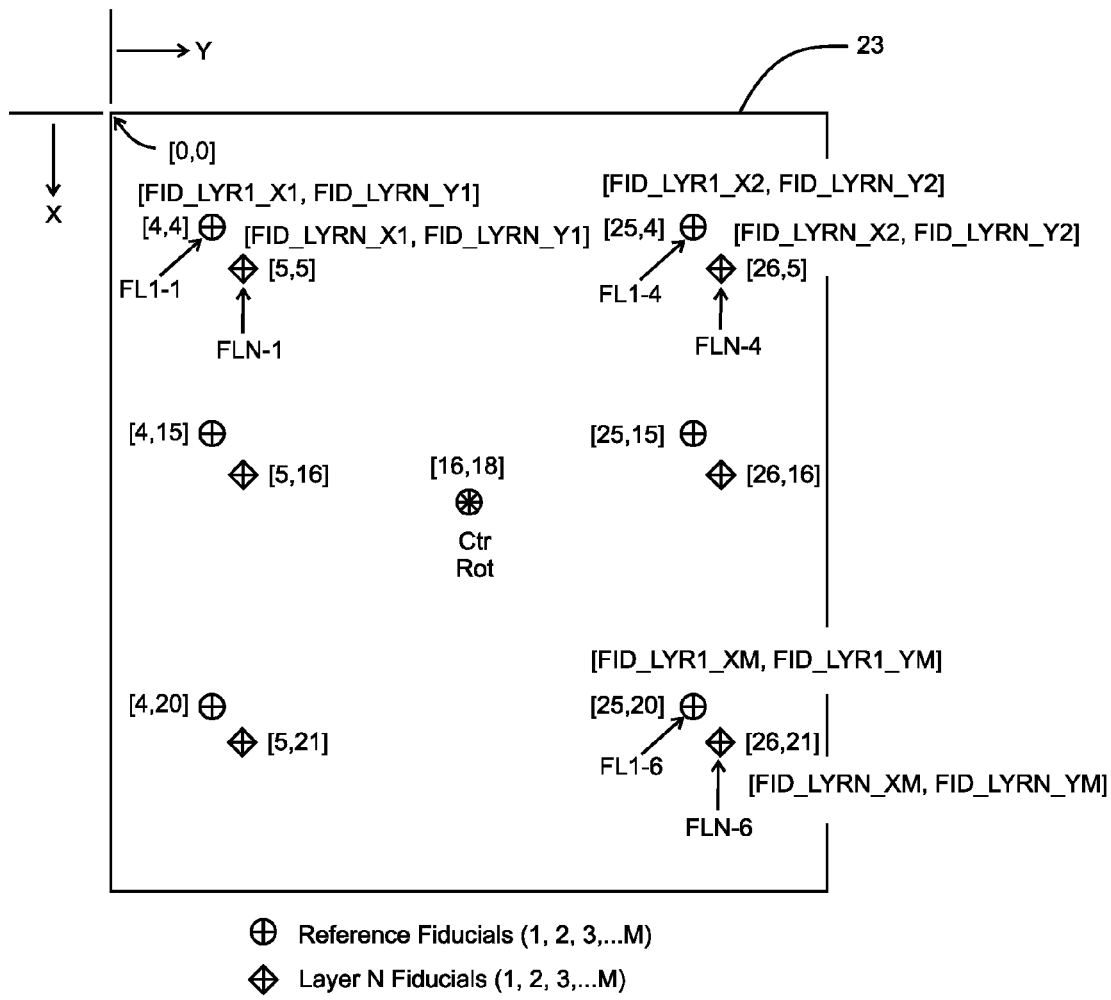
Fig. 4E  Layer N Offset From Layer 1

Fig. 6  Rotation for Fiducial Layer
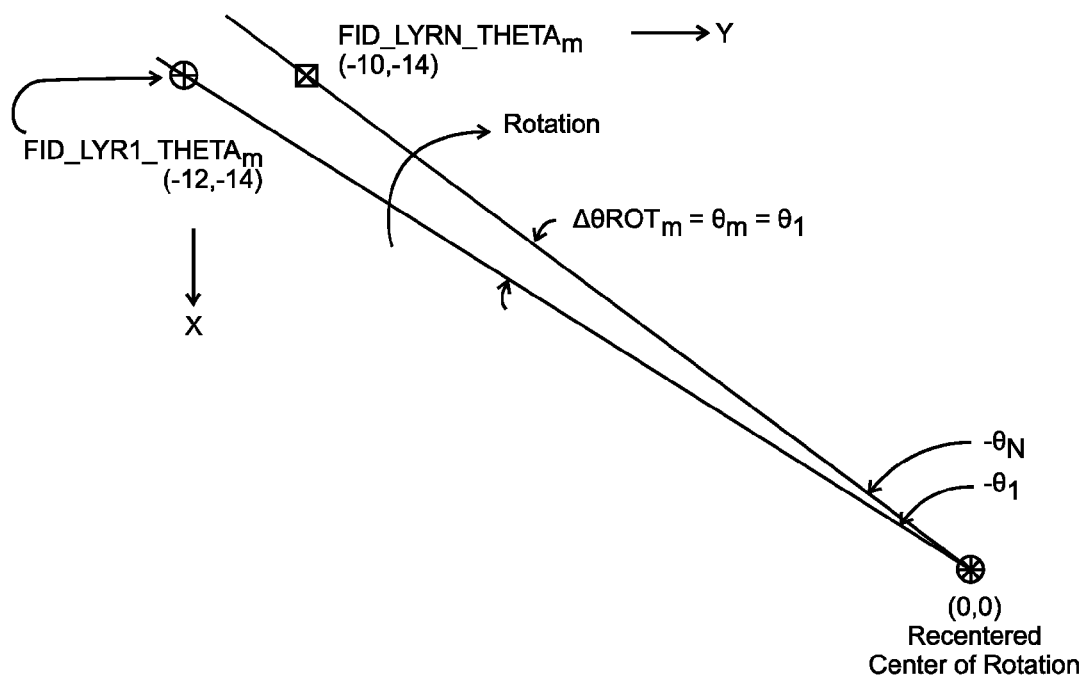

SYSTEM AND METHOD FOR LAYER-TO-LAYER COMPENSATION AND ERROR CORRECTION

BACKGROUND OF THE INVENTION

1. Field of the Invention

This invention relates primarily to gravure printing, but also applies to gravure offset and flexography printing and more particularly, to a method and apparatus for compensating for imperfect cylinders and machinery for layer-to-layer printing such that uniform material deposition and/or minimized subsequent over-lays of deposition occur.

2. Description of the Related Art

Traditionally gravure prints are judged visually. Both the sensitivity and the limitations of the human eye define the press tolerances. The printed electronic market operates on a functional electronic basis, not the former visual basis, and therefore is driven by a different set of criteria.

The visual requirement for layer-to-layer registration accuracy for traditional printing is approximately 75 microns, improving this to a smaller tolerance yields no perceived value. However, electronic devices and printed circuits are sensitive to several orders of magnitude less than the human eye. Hence registration requirements and systems for printed electronics must be much more precise.

These higher precision requirements tend to dramatically increase costs.

U.S. Pat. No. 5,329,215 is an approach for correcting errors associated with leadscrews used during engraving of a circuit Error Mapping.

U.S. Pat. No. 7,661,358 discloses an apparatus and method for forming a predetermined pattern on a substrate using a gravure offset printing method. The apparatus for forming a pattern using a gravure offset printing method comprises a gravure on which a pattern to be filled with a color resist is formed; a roller brought into contact with the gravure to transfer the pattern formed on the gravure to the roller and then to print the transferred pattern onto a substrate; a roller driving means for rotating and horizontally driving the roller to transfer the pattern formed on the gravure to the roller and then to print the transferred pattern onto the substrate as it is; and a substrate support on which the substrate is placed. Further, the roller driving means includes a rotational driving unit for rotationally driving the roller; a horizontal driving unit for horizontally driving the roller independently of the rotational driving unit; and a control unit for controlling driving speeds of the rotational and horizontal driving units. The device in contrast attempts to transfer the cylinder with pattern to the substrate with complete fidelity to the original cylinder.

SUMMARY OF THE INVENTION

One object of this invention is registering an imperfect or perfect cylinder with an imperfect or perfect pattern to another imperfect cylinder with imperfect or perfect pattern.

In another aspect, the present invention prints a modified pattern from the roller, not a direct copy. An error between patterned cylinders and maps a correction pattern, both statically and dynamically within the print cycle.

Still another object is to provide a system and method that performs both static and dynamic error corrections in multiple axes.

In one aspect, one embodiment of the present invention provides means to map and correct differences between multiple cylinders with multiple patterns such that each layer is deposited in close registration to the next. This allows the resulting system accuracy to be beyond the direct mechanical quality and ability.

In another aspect, the system and method allows an improvement of the deposited accuracy independent of the starting mechanics. Even very precise mechanics can be improved with the machines compensation methods.

In another aspect, the system and method compensates for errors electronically, rather than relying on only mechanical accuracy, thereby enabling the overall process costs to be contained.

In another aspect, the system and method allows lower precision cylinders through the advanced machine compensation methods.

One aspect defines a system which consists of bed, stocks, platen, cameras and control systems which enable electronic compensation of system errors.

Another aspect is allowing lower precision machine components to lower the machine manufacturing cost through advanced machine compensation methods.

Another aspect is allowing a less precise mounting of the cylinder with respect to the machine through the advanced machine compensation methods.

Another aspect of this invention allows the dynamic adjustment the cylinder and substrate positioning within a single print to compensate for mechanical imperfections of the machine and cylinder.

Another aspect allows for cylinder elongation or compression in the direction of the cylinder's axis to provide minor dimensional compensation between subsequent cylinders.

Another aspect allows for cylinder and machine compensation via thermal control of the cylinder to allow minor dimensional compensation between subsequent cylinders.

Another aspect of the invention allows for press automation. Such items include automatic substrate loading and unloading, automatic fiducial measuring for automated registration printing, automatic drying/curing and other converting functions.

Another aspect of the invention utilizes statistical process control (SPC) to analyze in real time the trends of the printing result and refine the compensation tables and parameters to adjust for slight changes as a result of marginal substrate, ink, cylinder or machine changes.

These and other objects and advantages of the invention will be apparent from the following description, the accompanying drawings and the appended claims.

BRIEF DESCRIPTION OF THE DRAWINGS

FIG. 1 is a perspective view of a layer-to-layer printing system in accordance with one embodiment of the invention;

FIG. 2 is a general schematic view showing further details of the system shown in FIG. 1;

FIG. 3B is a view showing the further details of the cruciform received in a slot in the bed of the system;

FIG. 4E is an illustration showing a layer N or subsequent layer offset from a preceding or previous layer, such as a first layer, illustrating the various offsets or registration errors between the layers;

FIG. 6 is a view illustrating a rotation offset between two layers; and

DETAILED DESCRIPTION OF THE PREFERRED EMBODIMENT

Figure 1A:
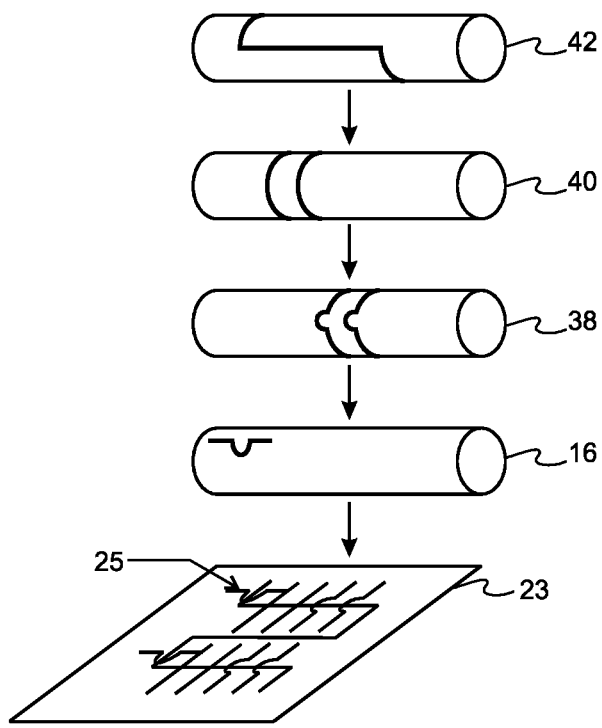
FIG. 1A is a view illustrating a plurality of cylinders illustrating the layer-to-layer printing on a substrate.

FIG. 1 is a general perspective view of an embodiment of a micro-gravure system and method, designated generally as system 10. In the illustration being described, the features of the embodiment are suitable for use with a micro-gravure system, such as the micro-gravure printing press manufactured and marketed under the trademark Accu-Press Micro-Gravure Printing System available from Daetwyler R&D Corporation located at 2133 Lyons Road in Miamisburg, Ohio 45342, which is the assignee of the present invention. It should be appreciated that the concepts and features of the system 10 and method described herein may be applicable to a roll-to-roll gravure press.

In the embodiment being described, the system 10 and method are particularly suited for use in a sheet-fed gravure press designed for high resolution printing with a variety of ink, including conductive, semi-conductive, insulated and barrier inks for printed electronic applications. In the illustration being described, the following types of inks may be used:

silver conductive ink from various suppliers, including, but not limited to:
1) Henkel
2) Applied Nanotech
3) DuPont Electronics Materials
4) Electra
5) Intrinsiq Materials
6) Vorbeck Materials
7) InkTec
8) Advanced Nano Products
9) Bayer MaterialScience
10) Creative Materials Incorporated
11) ESL ElectroScience
12) Ferro
13) Parelec, Inc.
14) Umicore
15) Xerox copper inks from various suppliers, including, but not limited to:
1) Novacentrix nanoinks from various suppliers, including, but not limited to:
1) NanoMas Technologies, Inc. located at 1093 Clark Street in Endicott, N.Y. 13760
2) Nanogram
3) Pchem conductive polymers ink from various suppliers, including, but not limited to:
1) Polyera
2) Novalead
3) Plextronics
4) Add Vision
5) Ercon
6) Hararus
7) Nano Ready OLED powders from various suppliers, including, but not limited to:
1) EMD Chemicals, Inc. located at 790 Memorial Drive in Cambridge, Mass. 02139
2) BASF Future Businesses
3) American Dye Source
4) CASORGANIC conductive coatings from various suppliers, including, but not limited to:
5) AGFA
6) Cambrios
7) CIMA NanoTech
8) Five Star Technologies carbon nanotubes from various suppliers, including, but not limited to:
1) Nanomas
2) Swent substrates from various suppliers, including, but not limited to:
1) Dupont-Teijin Films located at 3600 Discover Drive in Chester, Va. 23836
2) PolyIC
3) Flexvue Films The system 10 comprises a bed 11 (FIG. 1) having a headstock 12 and a tailstock 14 for rotatably supporting a cylinder 16, such as a gravure cylinder, that comprises a plurality of ink-receiving cups or cells (not shown) adapted to receive ink and transfer the ink to a substrate, such as a substrate 23. In the illustration being described, the cups or cells are engraved, etched, lasered or otherwise provided in a surface 16a of the cylinder 16 and define a pattern. For example, the features of the engraved cells and cylinders engraved with the systems and method and/or methods shown or described in U.S. Pat. Nos. 5,112,171; 6,269,718; 6,348,979; 6,362,899; 6,433,890; 6,515,772; 6,525,839; 6,614,558 and 7,715,058 may be utilized to engrave or otherwise provide the cylinder 16. These patents are incorporated herein by reference and made a part hereof. As is conventionally known, once the ink is received in the cups or cells, which are beneath the surface 16a of the cylinder 16, the ink is transferred or deposited to the substrate 23 by causing relative movement between the cylinder 16 and the substrate 23.

The headstock 12 and tailstock 14 encompass conventional chuck assemblies (not shown) and precision rotary bearings 18, 20 for clamping and rotatably supporting the cylinder 16. The clamping assemblies may be similar to or incorporate one or more of the features of clamp assemblies in one or more of the aforementioned patents.

The substrate 23 is secured to a platen 22 via conventional means, such as a vacuum or mechanical clamping force, and located using one or more locating pins 29a, 29b and 29c. In the illustration being described, the platen 22 has a thin elastomer surface 22a on the top layer of the platen 22. In a manner described later herein, the platen 22 travels in a direction or axis X on a first precision bearing rail 24 and a second precision bearing rail 26 as described later herein.

The system 10 further comprises a control computer or system 30 comprising application software that is responsible for the overall control of system 10 and handles inputs and outputs from a variety of sub-systems, components, a multi-axis servo control system/PLC, and cameras 34 and 36 described later herein. In the illustration being described, the application software is created by Daetwyler R&D Corp. of Miamisburg, Ohio U.S.A.

The system 10 may comprise at least one or a plurality of cameras, such as a first camera 34 and a second camera 36, that are used and facilitate aligning the substrate 23 to the cylinder 16. Although the embodiment being described is shown as having two cameras, it should be understood that less or more cameras may be used as desired. In the illustration being described, the plurality of first and second cameras 34 and 36 are adapted for aligning the substrate 23 relative to the cylinder 16 and aligning printing multiple layers on the substrate 23 from a plurality of cylinders. In one embodiment, the cameras 34 and 36 are Model No. GS2-FW-14S5M/C, Manufactured by Point Grey Research located in Richmond, BC, Canada. In other words, when it is desired to print a plurality of layers of printing onto the substrate 23, it is critical to align the printing onto the substrate 23 from each and every one of the cylinders, so that the layers of printing are precisely overlaid on top of each other. This is particularly critical when overlaying layers of conductive or semi-conductive patterns to provide a circuit. If the layers are not overlaid properly, the circuit may not function as desired. The operation of the first and second cameras 34 and 36 will be described later herein. The position of the platen 22 relative to the camera 36 is used to find an x and y centroid or center location, for example, of a registration mark or fiducial which could be manually (i.e., operator with cursors) or automatically determined.

For example, FIG. 1A is an illustrative view of a printing of a simple pattern or circuit 25. In the illustration, four cylinders 16, 38, 40 and 41, each cylinder 16 and 38-41 comprises a different electrical conductive pattern that creates a circuit 25 after the pattern from each of the cylinders 16, 38, 40 and 41 are applied, one after the other, to the substrate 23 as illustrated in FIG. 1A. For ease of illustration in the FIG. 1A, the patterns on each of the cylinders 16 and 38-41 are shown as solid lines, but it should be understood that they are comprised of a plurality of cups or cells that make up the lines or pattern shown. In this example, assume that each of the patterns from the cylinders 16 and 38-41, when combined, define the electrical circuit 25. If the patterns are not precisely aligned on the substrate 23, the circuit 25 may not function properly.

Accordingly, it is important to provide alignment and registration from one layer to the next when the layers are overlaid onto the substrate 23. The plurality of first and second cameras 34 and 36 are used in the manner described later herein to capture the locations of images of the cylinder surface 16a and substrate 23, respectively, so that registration of at least one or a plurality of registration marks or fiducials, which will be used in the manner described herein, to facilitate providing accurate measurement and alignment of the various layers. In this illustration, camera 34, which views the cylinder surface 16a, is used as a coarse alignment between the substrate 23 and the cylinder 16 as mentioned in step 206 of the flow chart in FIG. 5. Camera 36 which views the substrate 23 captures relative distance errors between a single pair or multiple pairs or sets of fiducials as will be described later.

Figure 2A:
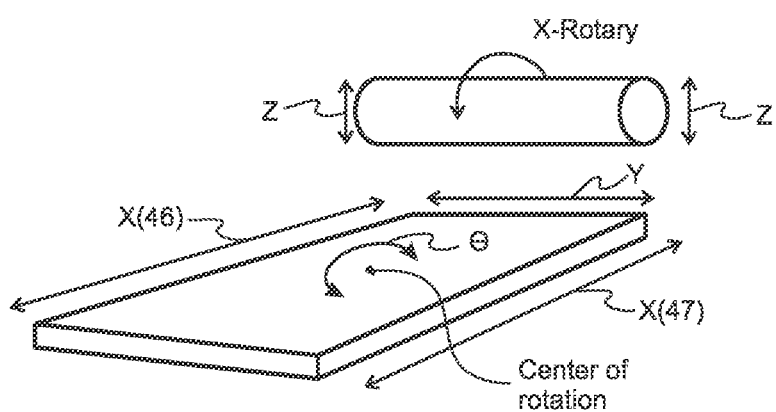
FIG. 2A is a diagrammatic view illustrating the various X, Y, Z, X-rotary and Theta axes for ease of understanding.

Referring now to FIG. 2, a user controlled interface 40 is coupled to the control computer 32 as shown and comprises a conventional keyboard (not shown), a mouse (not shown), and various switches (not shown) that are used to operate the system 10. A multi-axis servo controller and programmable logic controller (PLC) 42 is coupled to the control computer 32 as shown. In the illustration being described, the controller or PLC 42 is both a motion controller for controlling motion of the cylinder 16 and platen 22 and for controlling motion in each axis mentioned later herein and the machine sequencing logic and algorithm described later herein as well.

In order to accomplish registration of multiple layers of printing on the substrate 23, it is necessary to accurately control the relationship and movement of the platen 22 relative to the cylinder 16. This includes controlling the various axes shown diagrammatically in FIG. 2, as well as controlling the rotational speed of the cylinder 16 and the linear movement or speed during printing. For ease of description, the axes are shown and labeled with a part number as illustrated in FIG. 2. In the illustration being described, the multi-axis PLC 42, which are illustrated in FIG. 2 and identified as axes X1 (labeled with part number 44), X2 (labeled with part number 46), THETA (labeled with part number 48), $X_{rotary}$ (labeled with part number 50), Y (labeled with part number 52), $Y_{camera\ cylinder}$ (labeled with part number 56), $Y_{camera\ substrate}$ (labeled with part number 58), $Z_{headstock}$ (labeled with part number 60) and $Z_{tailstock}$ (labeled with part number 62).

The system 10 comprises at least one or a plurality of motors 64, 66, 68, 70, 72, 74, and 76 and at least one or a plurality of encoders 78, 80, 82, 84, 86, 88, 90 and 92 causing movement of at least one component, such as cylinder 16, platen 22, first and second cameras 34 and 36, at least one or each axis as described in more detail later herein. Each of the components are coupled to the multi-axis PLC 42 and under the control thereof, so that the cylinder 16 and platen 22 can be driven and registered in the manner described herein. In the illustration being described, each of the motors 64, 66, 68, 70, 72, 74, and 76 is driven by a drive signal (not shown) from PLC 42 that passes an appropriate motor driver 94 to handle the power requirements for steady-state and surge needs. It should be understood that an individual motor driver 94 exists for each of the motors 64, 66, 68, 70, 72, 74, and 76 for each driven axis. The aforementioned motors and drivers are conventionally known such as the motor and drivers offered by the Danaher Corporation of Washington, D.C. The motor of one or more components in each of the various axes will now be described.

One suitable multi-axis synchronized control is a multi-axis servo controller/PLC 42 such as model MC4U from ACS Motion Control of Eden Prairie, Minn. U.S.A. Such computers 32, 42 utilize servo mechanisms to accurately synchronize motions or movement of the platen 22 and/or cylinder 16 in the various axes relative to each other. Positional variations which deviate from a straight linear motion are corrected using a look-up table (LUT) associated with each axis that is stored in memory associated with computer 32. As will be described later herein, the look up table comprises optically measured position errors between fiducials relative to the layers that will be corrected by the computer 32 by communicating and loading the LUT of the appropriate axis to the multi-axis motion controller/PLC 42. If needed, the LUT values are translated to a format compatible with or as may be required by the PLC 42.

The X axis 47 motion of the platen 22 is in a print direction as viewed in FIG. 1. One purpose of the system 10 is to drive the substrate 23 and the platen 22 into printing contact with each of a plurality of cylinders such as the cylinders 16 and 28-41 (FIG. 1A) for printing. This is accomplished by driving the platen 22 in the printing direction along at least one or a plurality of bearings, such as the bearings 24 and 26 (FIG. 2), using at least one or a plurality of motors. In the illustration being described, the at least one or a plurality of motors include a first linear drive motor 64 and a parallel second linear drive motor 66. The respective axes of the first and second linear drive motors 64 and 66 are X1 (44) and X2 (46), respectively.

The $X_{rotary}$ axis 50 motion of the cylinder 16 is also in the print direction and is affected by a motor 74. The motor 74 rotatably drives the cylinder 16 in registration with the motion or movement of the platen 22, and hence substrate 23, for printing. This is accomplished by the multi-axis PLC 42 energizing the motor 74 and an encoder 84 attached to the headstock 12 which is coupled to the cylinder 16 as shown. In the illustration being described, the cylinder 16 is supported at its other end by tailstock 14. In the illustration being described and as conventionally known, the headstock 12 and tailstock 14 comprise free rotating bearings 18 and 20, respectively, for rotatably supporting the cylinder 16 between the headstock 12 and tailstock 14.

Motion or movement of the platen 22 is also caused to occur in the $\ominus$ axis 96. The axis 96 motion serves to put a yaw angle or movement on the platen 22 and hence substrate 23 relative to the axis of the cylinder 16. This is accomplished by the multi-axis PLC 42 controlling at least one or a plurality of linear drive motors 64 and 66 having associated encodes 78 and 80 for axis X1 (44) and axis X2 (46). In other words, a rotation, twist or yaw of the platen 22 can be affected by independently controlling the speed and distance at which the drive motors 64 and 66 having associated encodes 78 and 80 drive the platen 22. If no rotation, twist or yaw is desired, then the servo drives 64 and 66 are driven the same speed or distance, which causes the platen 22 to not rotate, twist or yaw relative to the cylinder surface 16a. In the illustration being described, the rotation, twist or yaw of the platen 22 is enabled through use of a cruciform, sprint or torsion component or mechanism 200 (FIG. 3) which allows rotary twist, but not lateral translation. It should be understood that the cruciform 200 enables a rotation, twist or yaw, but not translation, when the drive motors 64 and 66 having associated encodes 78 and 80 are driven with a variable position offset. In one embodiment, it should be understood that the rotation, twist or yaw corresponds to the $\ominus$ axis (96) shown in FIG. 2 and is typically less than about 0.05 radians, which is quite small. It should be understood, however, that a greater or lesser amount of rotation, twist or yaw may be used if needed.

Figure 3:
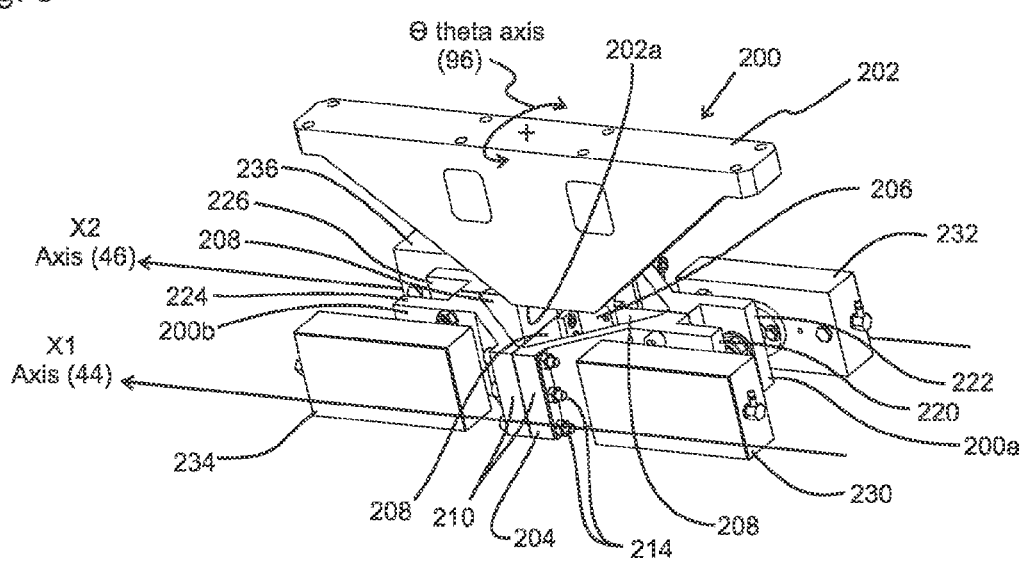
FIG. 3 is a view of a cruciform or multi-axes support that permits a platen to move in the Theta axis.
Figure 3A:
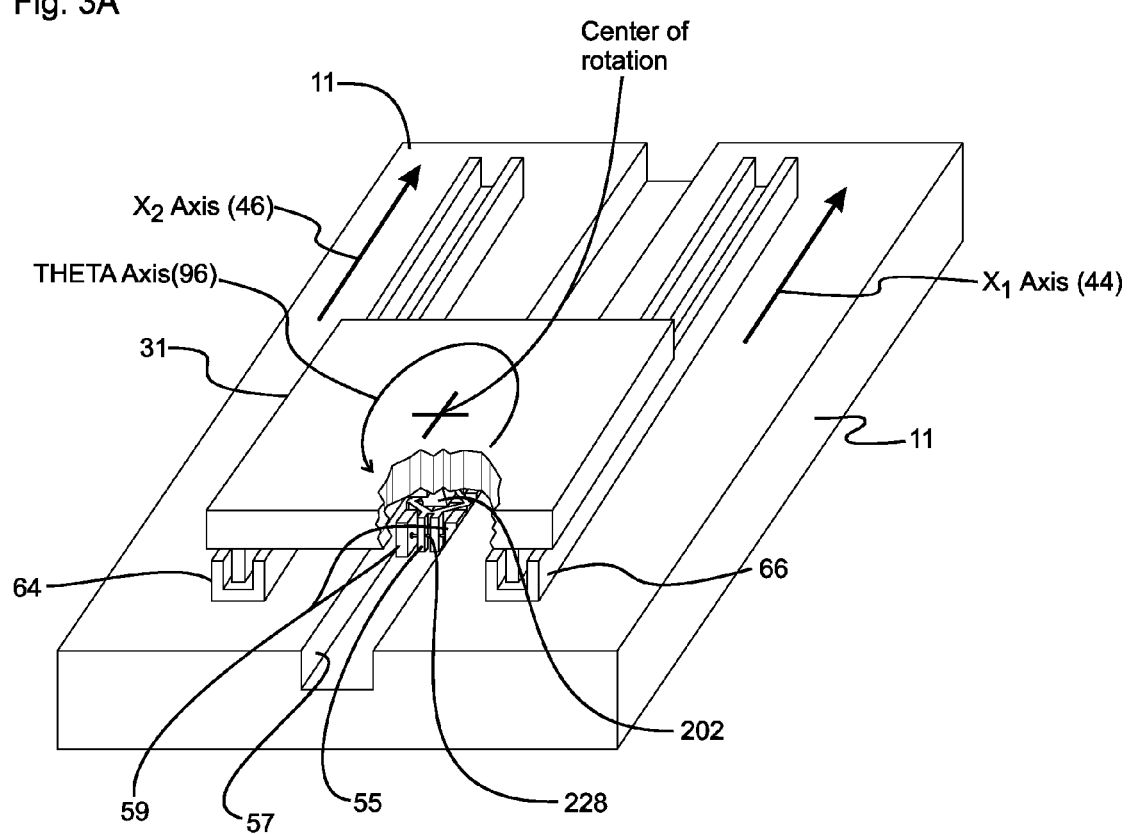
FIG. 3A is a view showing the platen mounted on a bed of the system.

As illustrated in FIGS. 3, 3A and 3B, note that the cruciform 200 comprises a keel 202 that is mounted to the platen support 31 and to a cruciform assembly 204. The cruciform assembly 204 comprises a center mounting support 206 that is bolted or welded directly onto a bottom 202a of the platen support 31. The center mounting support 206 comprises a plurality of threaded apertures 206a for threadably coupling to ends of a plurality of planar springs 208 as shown. The other end of each of the plurality of planar springs 208 are mounted to a plurality of spring supports 210 as shown. The plurality of spring supports 210 are secured together using conventional means such as a nut and bolt 214. When assembled, note that the spring support 210 comprises a plurality of stabilizers or projections 220, 222, 224 and 226 on a first end 200a that receive a threaded screw 228 (FIG. 3B). Note that the ends of the threaded screws are coupled to and supported by a plurality of air bearings 230 and 232. It should be understood that the opposing end of the cruciform assembly 204 is similarly constructed and assembled with the opposing end 200b comprising the air bearings 234 and 236 which support the end 200b.

As alluded to earlier herein, the air bearings 230-236 are coupled to conventional air supply (not shown) and the assembly 204 is received in the slot 57 as best illustrated in FIG. 3B. Note that while the cruciform assembly 204 may travel in the X-axis, it does not travel in the Y-axis or in the Theta axis. However, as mentioned herein, the platen 22 may be caused to travel in the Theta axis, X-axis and the Y-axis. The cruciform assembly 204 permits rotational movement of the platen 22 about its vertical axis or yaw, thereby permitting movement in the Theta axis. The springs 208 are resilient and when not flexed, the platen 22 remains in a unbiased home position wherein a leading edge 22a is generally perpendicular to the direction of travel.

It should be understood that the cruciform 200 is mounted directly to a platen support 31 on which the platen 22 is drivably mounted. It should be understood that the platen support 31 is driven in the X-axis during printing and error correction. The platen 22 does not move in the X-axis direction relative to the platen support 31 during such X-axis movement of the assembly. However, during the movement of the platen 22 in either the Y-axis or Theta axis, the platen 22 does move relative to the platen support 31.

Referring now to FIG. 3A, a fragmentary and simplified view of the platen 22 and its motion is illustrated. As shown in FIG. 3A, the platen 22 is drivably mounted on the platen support 31 which in turn is mounted on the bed 11 via the cruciform assembly 204 as shown. The support 31 comprises a keel 202 that is received in a keel slot 57 in the bed 11. The keel 202 comprises two pairs of air bearings 230, 232 and 234, 236 as shown. As described above, it should be understood that the keel 202 permits rotation around a center of the keel, but not laterally and in the Y axis direction. The first and second drive motors 64 and 66 drive the platen support 31 and platen 22 along the slot 57 and on the bed 11. As illustrated in FIG. 2, the first and second drive motors 64 and 66 comprise the associated linear encoder 78 and 80, respectively, that are moved very accurately with respect to each other so that small differences in travel can be controlled. As alluded to earlier herein, by driving the first and second motors 64 and 66 at different rates or distances, a slight pivoting or rotation of the platen 22 around the center of the rotation (labeled in FIG. 3A) is caused to occur. The $\ominus$ axis of rotation comes from the differential distance commanded. In other words, if, for example, the first drive motor 64 is driven a first distance and the second drive motor 66 is driven a second distance, which is greater or less than the first distance, the rotation of the platen 22 results.

Advantageously, the system and method described herein enable the platen 22 to be rotatably adjusted about the $\ominus$ axis when desired to facilitate correcting for run out. It should be understood, however, that this is typically not the sole correction that occurs and indeed the system 10 may utilize other means for error correction. The multi-axis design is intended to allow a composite correction which consists of errors in each of the mentioned axes.

Movement of the platen 22 in the Y axis 52 is in a direction that is generally parallel to an axis of the cylinder 16. The purpose of the movement of the platen 22 in the Y axis 52 is to facilitate driving the platen 22 relative the fixed cylinder 16 for printing registration. This is accomplished by the multi-axis PLC 42 energizing a linear drive motor 68 along the at least one or a plurality of bearings, such as a first bearing 102 and a second bearing 104.

It should be understood that movement of the cylinder 16 in the Y axis 52 is also effected by an environmental control system 106 that is integrated into the system 10. In the illustration being described, the environmental control system 106 passes heated or chilled air through a conduit 99 and the patterned or engraved cylinder 16 to provide dimensional control through thermal growth or shrinkage. The thermal growth or shrinkage of the cylinder 16 can occur for various reasons including temperature of ambient surroundings, heat generated through friction associated with printing, heating or cooling of functional inks, and other reasons yet to be determined. A circumference of the cylinder 16 is also affected, and this can be compensated by movement of the cylinder 16 in the X rotary axis 46 motion and/or X axis 47 motion as described earlier herein. Note that the environmental control system 106 comprises and uses various temperature sensors 108, 110 and 112 along with at least one or a plurality of humidity sensors 114. Although the primary goal of the environmental unit is to control cylinder dimensions in the Y-axis direction, a cylinder's diameter will also grow in relation to a changed temperature resulting in a change spreading or comparing of fiducial marks. It should also be understood that the multi-axis PLC 42 is capable of compensating for this change via adjustments to its LUT correction values, which in this case would primarily occur in the X-axis to correct for a cylinder circumference change. It is also possible to predict these corresponding changes through the sensed information from temperature sensors 108, 110 and 112 and humidity sensor 114. In the illustration being described the heated or chilled air flow initiates out of the environmental control system 106 which contains both heating and cooling capabilities and a convection fan to circulate the controlled air through an outflow port 116, through the conduit 99, into headstock 12, through cylinder 16, tailstock 14 and finally back to the environmental control system 106 through the convection return port 118.

Referring now to the Z axis motion, the movement of the cylinder 16 in the Z axis 48 is in a vertical direction (as viewed in the FIG. 2) which is generally perpendicular to an imaginary plane in which the platen 22 lies. A cylinder 16 height relative to the platen 22 can be changed such that a compression force (sometimes referred to as a nip force) between the printing cylinder 16 and the substrate 23, which is situated on the platen 22, can be controlled and adjusted. Such movement of the cylinder 16 is accomplished by synchronously driving a height of the headstock 12 and tailstock 14. The motion of the cylinder 16 in a $Z_{headstock}$ axis or direction 60 is accomplished by driving the headstock 12 along bearings 118a and 118b (FIG. 1) using at least one or a plurality of motors, such as a servo motor 92 and associated encoder 90, both of which are under control by the multi-axis servo controller and PLC 42. Similarly, movement of the tailstock 14 in the $Z_{tailstock}$ axis is accomplished by driving the tailstock 14 along bearings 118c and 118d (FIG. 1) using at least one or a plurality of motors 76 and associated encoder 90.

It may be necessary to drive the first and second cameras 34 and 36 in the Y axis or in the directions of arrows 56 and 58 in a direction that is generally parallel to the cylinder axis. One purpose of the movement of the first and second cameras 34 and 36 is to capture at least one or a plurality of images at any location on the surface 16a of the cylinder 16 and substrate 23, respectively. This is accomplished by synchronizing the motion of the first and second cameras 34 and 36 with the rotary motion of the cylinder 16 in the $X_{rotary}$ 50 axis or direction. A movement of the first and second cameras 34 and 36 is accomplished by driving the first and second cameras 34 and 36 along at least one or a plurality of bearings 120 using a motor 122 and associated encoder 124, both of which are fed with signals from the multi-axis PLC 42. In this regard, it should be understood that the first camera 34 is adapted to capture an image of a surface 16a of the cylinder 16 while the second camera 36 is adapted to capture and image of the substrate 23 on the platen 22. Analogously, the motion of the second camera 36 in the Y axis is also in the direction that is parallel to the cylinder 16 axis. The purpose of the second camera 36 and such motion is to view any location on the substrate 23. This is accomplished by synchronizing the motion of the second camera 36 with the movement of the platen 22. A bearing slide 119 ensures the cameras 34 and 36 run parallel to the cylinder 16. The positioning of the second camera 36 along the Y axis is accomplished by driving the second camera 36 along at least one or a plurality of bearings 120 using a motor 122 and associated encoder 124, both of which are coupled to and under the control of the multi-axis PLC 142. It should be understood that camera 34 which views the cylinder surface 16a is used as a coarse alignment between the substrate 23 and the cylinder 16 as mentioned in step 206 of the flow chart in FIG. 5. Camera 36, which views the substrate 23, captures relative distance errors between a single pair or multiple pairs of fiducials as will be described later. Thus, it should be noted that the cameras 34 and 36, which could be microscopes, look for positions or locations of fiducials on the substrate 23 and cylinder 16.

As previously mentioned, one object of the embodiments being described is to enhance registration between or among layers of printing. Registration accuracy is measured as the displacement of printed detail from aligning perfectly. The measured displacement is registration error. Registration error is the displacement of a detail in a subsequent layer that does not line up directly with the same detail in a previous layer or reference layer. A tool used to measure this error is the set of the registration marks or the fiducial marks mentioned earlier that are printed directly on each other from layer to layer. The displacement of these marks from perfect alignment is the measurement of misregistration.

Misregistration can take place over the entire copy or in limited areas within a printed area or substrate 23. Registration errors that involve the entire copy can be corrected by a single adjustment for the entire copy are referred to herein as "static errors" and need static corrections. Errors which take place in only a portion of the substrate 23, such as in the center region but not the start or end of the substrate 23, are referred to as "dynamic errors" and require dynamic corrections.

Errors can be displacement errors, scaling errors, and rotation errors. A displacement error is a shift in location. A scaling error is a magnification or demagnification. A rotation error is a shift in location about an axis of rotation perpendicular to the plane of the substrate 23 and with a defined center of rotation where the axis of rotation intersects the plane of the substrate 23. For ease of description, this error is defined as an error in the Theta axis.

The platen 22 that is carrying the copy through the printing nip has freedom of motion in two translational axes, X and Y, and one rotational motion, Theta. The motion in the direction of printing is the X axis. Motion perpendicular to the direction of printing in the plane of the printing is the Y axis. Rotational motion, the Theta axis, is about a center of rotation (as viewed, for example, in FIG. 2A) located at the center of carrier holding the copy being printed. An example of a dynamic offset error would be where the image cylinder has runout error such that the middle of the copy print is offset in the X direction with respect to the start and finish of the copy. An example of a scaling error would be a cylinder whose circumference is too large and would require that the copy move a small additional distance to maintain registration. An example of rotational, Theta, error would be a cylinder that has a slight taper so that the copy might be tilted, say, to the left at the beginning of the copy and tilted slightly to the right at the end of the copy. Thus, the copy would need to rotate slightly as the printing takes place.

Each axis of motion can be adjusted before the start of printing a copy or during the printing of a copy. The relative position of a detail within an individual pass of a printing of a copy can be adjusted by adjusting the copy being printed with respect to the cylinder 16 that transfers the ink to the copy in the locations defined by the job being printed. That is, the registration of a layer of copy being printed to a previous layer already printed can be adjusted in real time as the copy is passing through the nip of the printing process. As is known, the nip is the line of contact where the cylinder meets the copy being printed upon and is where the ink is transferred to the paper or substrate of the copy.

To correct a positional offset in the middle of a copy that is properly aligned at the beginning and the end requires that the copy be sped up or slowed down relative to the cylinder 16 during the printing pass in order to move the relative position of the printing at the middle of the copy with respect to the beginning and end of the copy. To correct a scaling error in the direction of printing requires that the copy travel faster or slower through the region of printing that the cylinder laying down the ink. To correct rows of information that are rotated to the left and or right through the copy requires that the copy be rotated as necessary during the travel of the copy through the nip as the copy is being printed. All of these correction motions result in the copy being printed slipping while in contact with the cylinder carrying the ink being printed. This slipping motion is accomplished by the servomotors 64, 66, 68, 70, 72, 74, and 76 moving the individual moving parts of the press. The slipping motion is intentional and controlled with precisional accuracy and speed necessary to meet the registration requirements of the job being printed. The slipping motion takes place in multiple axes simultaneously.

Controlling the error between printed layers can be accomplished either mechanically or through servomecontrol correction. Controlling registration errors mechanically below about 50 microns is very difficult and servocontrol corrections are the preferred method. When servocontrol error control methods are in place larger mechanical errors are acceptable and production costs can be reduced through allowed relaxed mechanical tolerances.

It should be understood that the movement of the various components, such as the platen 22, first and second cameras 34 and 36, cylinder 16, headstock 12 and tailstock 14 and at least one or a plurality of the axes X1, X2, $X_{rotary}$, X3, Y, $Z_{headstock}$, $Z_{tailstock}$, $Y_{camera\ cylinder}$ and $Y_{camera\ substrate}$ are all synchronized to each other through the control computer 32 and the servo mechanism of the multi-axis PLC 42.

One feature of the embodiment being described is that a pair of desired axes, such as axes X (47) through X1 and X2 and $X_{rotary}$ (50), can be driven at different rates or movement profiles to electronically match the registration of at least one or a plurality of the cylinders 16 and 38-41 at least one of a plurality of cylinders 16, 38-41. The above example would be needed to register two cylinders which have a slightly different circumference. This process of registration is described in more detail later herein relative to FIG. 4. In this regard, during a set-up process an error correction table or look-up table LT is created which the control computer 32 uses during run-time printing to correct for learned registration errors.

Returning to the illustration, it is important to locate and measure a location of a registration mark, point or fiducial in order to achieve proper alignment during an alignment or registration process. The registration marks, points or fiducials on a surface of the substrate 23 can be examined, viewed and their position captured by the second camera 36 by using a coordinated and synchronized move between the substrate 23 and the platen 22 in the Y axis so that the registration mark, point or fiducial is within a field of view of the second camera 36 in the illustration being described. In this regard, the second camera 36 may comprise a microscope or other optics (not shown) to facilitate capturing the location of an image of the registration mark, point or fiducial. Note that the relative locations of the registration marks, points and fiducials printed by one cylinder, such as cylinder 16, can be determined through automatic measurement or through operated-assisted measurements, such that the registration mark, point or fiducial of interest is centered under, for example, microscope or the second camera 36.

Once the second camera 36 or microscope has the registration mark, point or fiducial in its "cross hair," that exact point in the X, Y, and $Y_{camera\ substrate}$ axes or coordinates are captured and stored in memory (not shown) for use in a correction or registration process to facilitate reducing or eliminating the layer-to-layer placement error. A set of equations are used to perform a static alignment in the X, Y and $\Theta$ axes, and these equations are used for dynamic correction or compensation. The equations utilize a multi-dimensional array of registration marks, points or fiducial locations, which are illustrated and described later herein relative to FIGS. 4A-4D, and that are mathematically defined such that each layer of the substrate 23 is printed, locations of the registration marks, points or fiducials for the previous layers are collected into mathematical arrays of values. In this regard and as explained in more detail later, the first layer printed on the substrate 23 is the reference set of locations to which subsequent layers will be aligned. Thus, it should be understood that during a typical error correction process, a first pattern or layer will be printed on the substrate 23, (for example, by cylinder 16) and then the subsequent layers or patterns will be printed on the same substrate 23, one at a time, with the subsequent cylinders (such as cylinders 38-41). Thus, at least one substrate 23 will be used as a sacrificial substrate during the alignment and correction process. The aforementioned equations are as follows:

Before implementing a more complication dynamic correction, where synchronized axes are shifted relative to each other to reduce the layer-to-layer placement error, a simpler static correction must be performed to reduce the X, Y and THETA substrate positional errors. Note that the basic equations used to perform a static alignment in the X, Y and THETA axis are also used for dynamic compensation. These equations are defined as follows:

The multi-dimensional array of fiducial locations shown in Figure X is mathematically defined as follows:

As each layer of the substrate is printed, the locations of the fiducial marks for the previous layers are collected into arrays of values.

The first layer printed on the substrate is the reference set of locations to which subsequent layers will be aligned.

[FID_LYR1]=[FID_LYR_REF]([ . . . ] being an array of XY pairs)

Subsequent layers are labeled:

[FID_LYR2]

[FID_LYR3]

[FID_LYR4]

[...]

[FID_LYRN]

Where N=printed layer number (N=1, 2, 3 ... n)

Each Fiducial Layer Array consists of a set of X & Y values corresponding to Fiducial numbers 1 through m in the matrix defined below:

The following matrix of $$[\text{FID\_OFST\_LYR1toN}] = [\text{FID\_LYRN}] - [\text{FID\_LYR1}](\text{Array of offsets})$$

$$= \begin{bmatrix} \text{FID\_LYRN\_X1} - \text{FID\_LYR1\_X1} & \text{FID\_LYRN\_Y1} - \text{FID\_LYR1Y1} \\ \text{FID\_LYRN\_X2} - \text{FID\_LYR1\_X1} & \text{FID\_LYRN\_Y2} - \text{FID\_LYR1\_Y1} \\ \text{FID\_LYRN\_X3} - \text{FID\_LYR1\_X1} & \text{FID\_LYRN\_Y3} - \text{FID\_LYR1\_Y1} \\ \ldots & \ldots \\ \text{FID\_LYRN\_XM} - \text{FID\_LYR1\_X1} & \text{FID\_LYRN\_YM} - \text{FID\_LYR1\_Y1} \end{bmatrix}$$

Where m=fiducial number of the layer (m=1, 2, 3 ... M)

For the case of a simple offset adjustment, a single value of servo offset adjustment is required. It is defined by the average error as shown below:

$$\text{FID\_OFST\_LYR1toN\_X\_SINGLE} = \sum \left( \frac{(\text{FID\_OFST\_LYR1toN\_X1toM})}{M} \right)$$

$$\{n = 1 \text{ to } N \text{ and } m = 1 \text{ to } M\}$$

$$\text{FID\_OFST\_LYR1toN\_Y\_SINGLE} = \sum \left( \frac{(\text{FID\_OFST\_LYR1toN\_Y1toM})}{M} \right)$$

$$\{n = 1 \text{ to } N \text{ and } m = 1 \text{ to } M\}$$

Rotation (Theta)

Figure 4A:
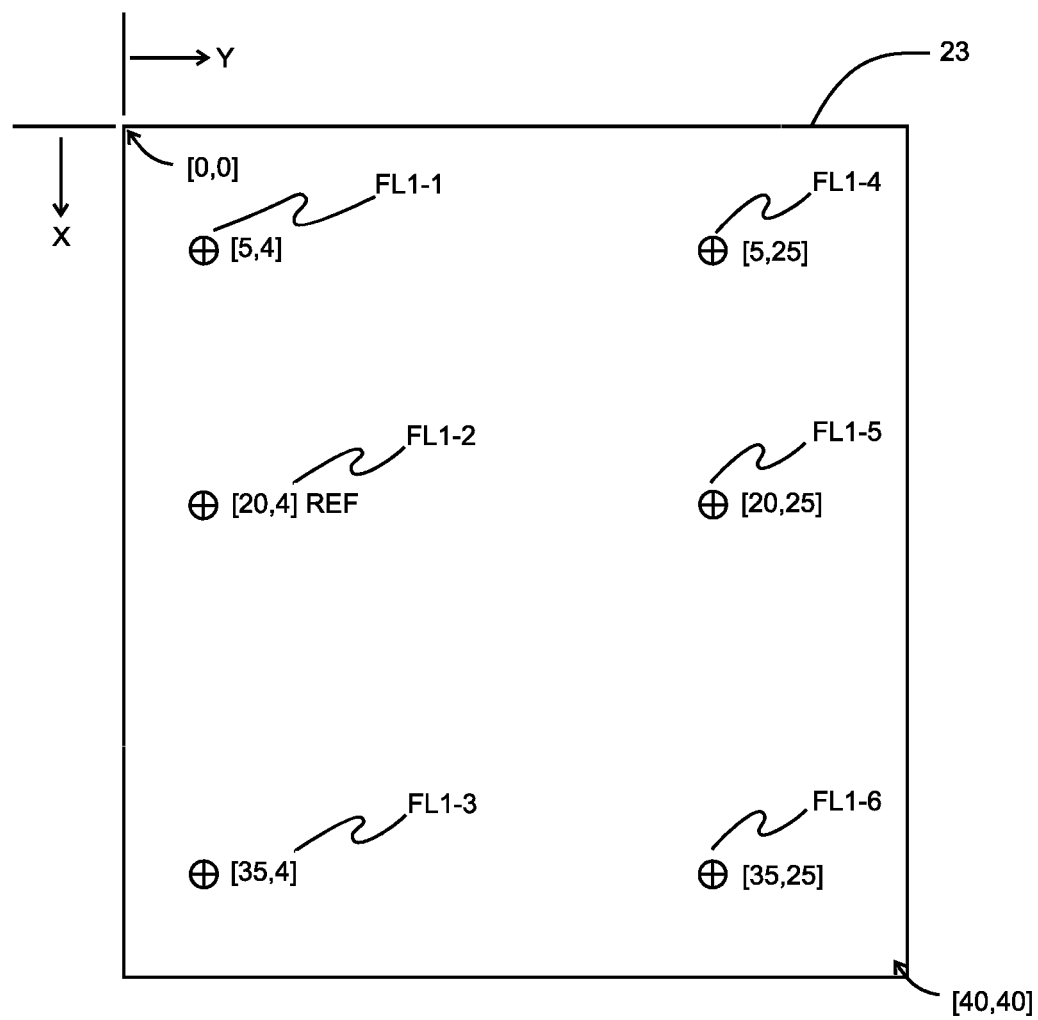
FIG. 4A is a view of a substrate having a first layer of fiducials printed thereon.
Figure 4B:
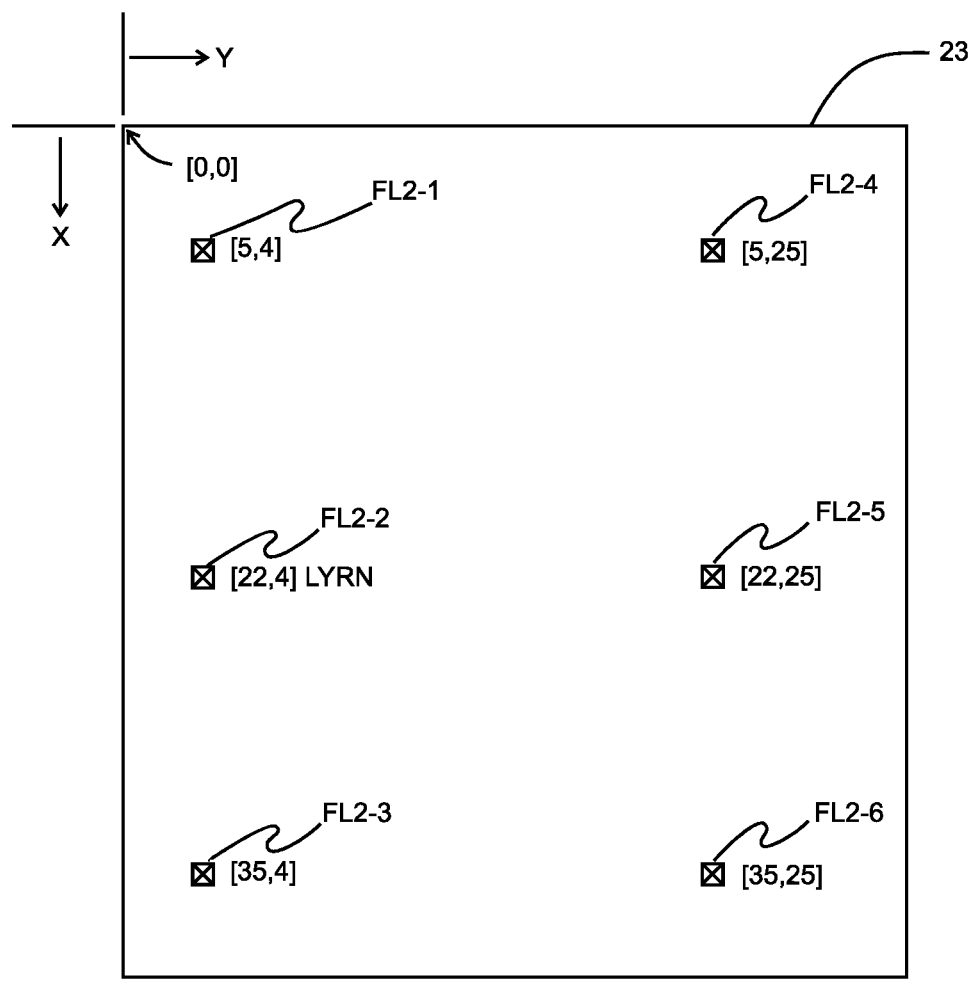
FIG. 4B is a view of a substrate having a second set of fiducials associated with a second printing layer printed thereon.

Similarly, for rotational calculations the location arrays will be re-referenced to the center of rotation (re-centered=RCTR) as defined in FIG. 4B. The resulting arrays for N layers of printing are defined by:

[FID_LYR1_RCTR]
[FID_LYR2_RCTR]
[...]
[FID_LYRN_RCTR]

Where n=printed layer number (n=1, 2, 3 ... N)

The rotation correction of the substrate takes place about the physical axis of rotation of the carriage. That center of rotation is offset from the substrate zero reference by LOC_CTR_$X=X$distance=−150 mm (typical)

LOC_CTR_$Y=Y$distance=−100 mm (typical)

Which are represented by the array:

[LOC_CTR]=[LOC_CTR_$X$ LOC_CTR_$Y$]

Re-centering is accomplished by:

$$[\text{FID\_LYRN\_RCTR}] = [\text{FID\_LYRN}] - [\text{LOC\_CTR}]$$

$$= \begin{bmatrix} \text{FID\_LYRN\_X1} - \text{LOC\_CTR\_X} & \text{FID\_LYRN\_Y1} - \text{LOC\_CTR\_Y} \\ \text{FID\_LYRN\_X2} - \text{LOC\_CTR\_X} & \text{FID\_LYRN\_Y2} - \text{LOC\_CTR\_Y} \\ \text{FID\_LYRN\_X3} - \text{LOC\_CTR\_X} & \text{FID\_LYRN\_Y3} - \text{LOC\_CTR\_Y} \\ \ldots & \ldots \\ \text{FID\_LYRN\_XM} - \text{LOC\_CTR\_X} & \text{FID\_LYRN\_YM} - \text{LOC\_CTR\_Y} \end{bmatrix}$$

$$= \begin{bmatrix} \text{FID\_LYRN\_RCTR\_X1} & \text{FID\_LYRN\_RCTR\_Y1} \\ \text{FID\_LYRN\_RCTR\_X2} & \text{FID\_LYRN\_RCTR\_Y2} \\ \text{FID\_LYRN\_RCTR\_X3} & \text{FID\_LYRN\_RCTR\_Y3} \\ \ldots & \ldots \\ \text{FID\_LYRN\_RCTR\_XM} & \text{FID\_LYRN\_RCR\_YM} \end{bmatrix}$$

Where m=fiducial number of the layer (m=1, 2, 3 ... M)

Polar Conversion (Theta)

The re-centered vectors are in rectangular coordinates (XY definition). What is desired is a single angle value for the carriage to be rotated to bring the layer fiducials back under the reference layer fiducials. That single value will be the average of the rotation values for each individual fiducial in the array. For that the set of vectors will be converted to polar coordinates.

The X, Y coordinate pair will be converted to R (radial length), T (theta). The basic conversions are:

$R = \sqrt{X^2 + Y^2}$ Radial length of the vector $T = \tan^{-1}(Y/X)$ Angle in Radians from $X$ axis FID_LYRN_RADIALm =

SQRT((FID_LYRN_RCTR_Xm)$^2$ + (FID_LYRN_RCTR_Ym)$^2$)

$$\text{FID\_LYRN\_THETAm} = \text{ATAN}\left(\frac{\text{FID\_LYRN\_RCTR\_Ym}}{\text{FID\_LYRN\_RCTR\_XM}}\right)$$

Therefore:

$$[\text{FID\_LYRN\_POLR}] = [\text{FID\_LYRN\_RADIALm} \quad \text{FID\_LYRN\_THETAm}]$$

$$= \begin{bmatrix} \text{SQRT}\begin{pmatrix} (\text{FID\_LYRN\_RCTR\_X1})^{\wedge}2 + \\ (\text{FID\_LYRN\_RCTR\_Y1})^{\wedge}2 \end{pmatrix} & \text{ATAN}\left(\dfrac{\text{FID\_LYRN\_RCTR\_Y1}}{\text{FID\_LYRN\_RCTR\_X1}}\right) \\ \text{SQRT}\begin{pmatrix} (\text{FID\_LYRN\_RCTR\_X1})^{\wedge}2 + \\ (\text{FID\_LYRN\_RCTR\_Y1})^{\wedge}2 \end{pmatrix} & \text{ATAN}\left(\dfrac{\text{FID\_LYRN\_RCTR\_Y2}}{\text{FID\_LYRN\_RCTR\_X2}}\right) \\ \cdots & \cdots \\ \text{SQRT}\begin{pmatrix} (\text{FID\_LYRN\_RCTR\_Xm})^{\wedge}2 + \\ (\text{FID\_LYRN\_RCTR\_Ym})^{\wedge}2 \end{pmatrix} & \text{ATAN}\left(\dfrac{\text{FID\_LYRN\_RCTR\_Ym}}{\text{FID\_LYRN\_RCTR\_Xm}}\right) \end{bmatrix}$$

Then the array of rotation values, in Radians, for each vector (m) is the difference of the Theta values in the polar coordinates. This is a single column array of values:

$$[\text{FID\_LYRN\_ANGLE}] = \begin{bmatrix} \text{FID\_LYRN\_THETA} - \\ \text{FID\_LYR1\_THETA} \end{bmatrix}$$

$$= \begin{bmatrix} \text{FID\_LYRN\_THETA1} & - & \text{FID\_LYR1\_THETA1} \\ \text{FID\_LYRN\_THETA2} & - & \text{FID\_LYR1\_THETA2} \\ \cdots & & \cdots \\ \text{FID\_LYRN\_THETAM} & - & \text{FID\_LYR1\_THETAM} \end{bmatrix}$$

The final single value to rotate the carriage is the average over the angles(m)

$$\text{FID\_LYRN\_ANGLE\_SINGLE} = \left( \sum \left( \frac{\text{FID\_LYRN\_ANGL\_Tm}}{M} \right) \right) \{m = 1 \text{ to } M\}$$

Figure 7A:
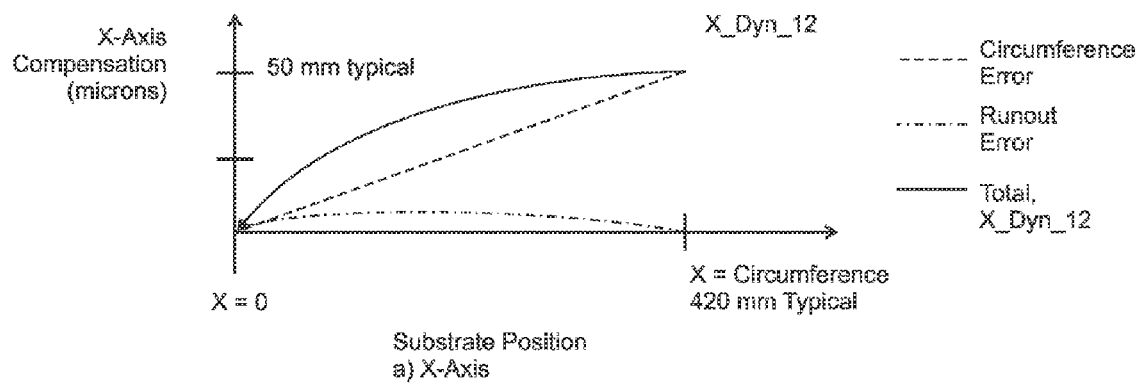
FIGS. 7A-7C illustrate various compensations in the X (FIG. 7A), Theta (FIG. 7B) and Y (FIG. 7C) axes.
Figure 7B:
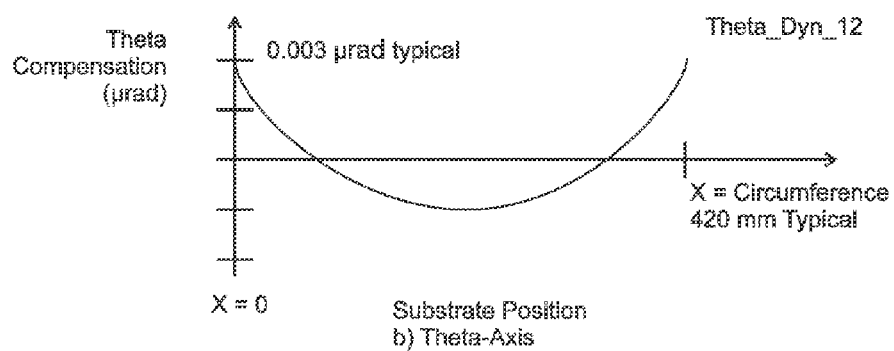
Figure 7C:
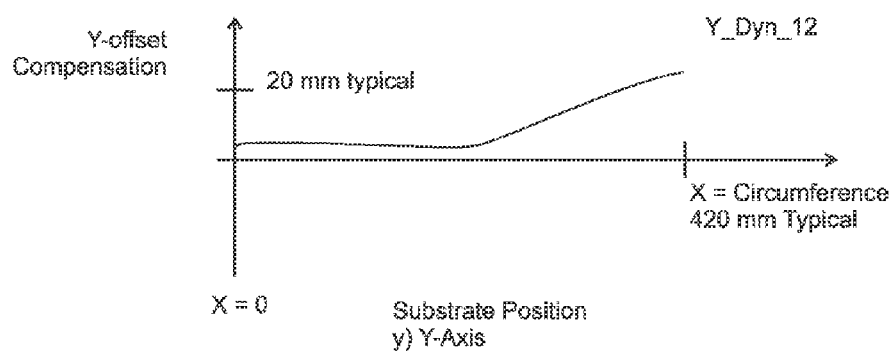

When calculations are done, the values are stored in memory of control computer 32 which in-turn translates these errors into a look-up-table (LUT) format acceptable to the multi-axis servo/PLC controller 42 such that axes motions are adjusted and synchronized to minimize at least one or a plurality of the relative positional or registration errors. An example of the resulting error between two layers associated with such a LUT correction is graphically shown as the bowed curve in FIG. 7A. FIG. 7A illustrates a relationship between the X-axis compensation relative to a substrate 23 position. FIG. 7B illustrates a dynamic theta-axis or rotational error correction curve of LUT values for a correction in the Theta axis. FIG. 7C shows a Y-axis compensation for correcting the substrate position in the Y-axis.

FIG. 6 shows the method of angle measurement associated with the Theta axis. Angles are defined with respect to the center of rotation of the carriage. The vector is drawn from the center of rotation to the point being measured. The X axis is the zero angle reference and a positive angle rotates clockwise from the X axis since the Y axis increases moving clockwise from the X axis in the coordinate system definition for the press. In the figure, a rotation of the error from Theta1 to ThetaN is positive.

For ease of understanding, FIGS. 4A-4E illustrate a series of registration marks or fiducials on the printed substrate 23 from two layers of printing. For ease of understanding and illustration, the fiducials for the first layer of printing, which in the illustration being described will be the printing by the cylinder 16, are labeled FL1-1 to FL1-6. Note that the fiducials FL1-1 to FL1-6 each have a corresponding matrix value which will depend on the position of the fiducial on the substrate 23 as shown. In the illustration being described, the matrix values are shown to the right of the fiducials in the illustrative FIG. 4A.

Figure 4C:
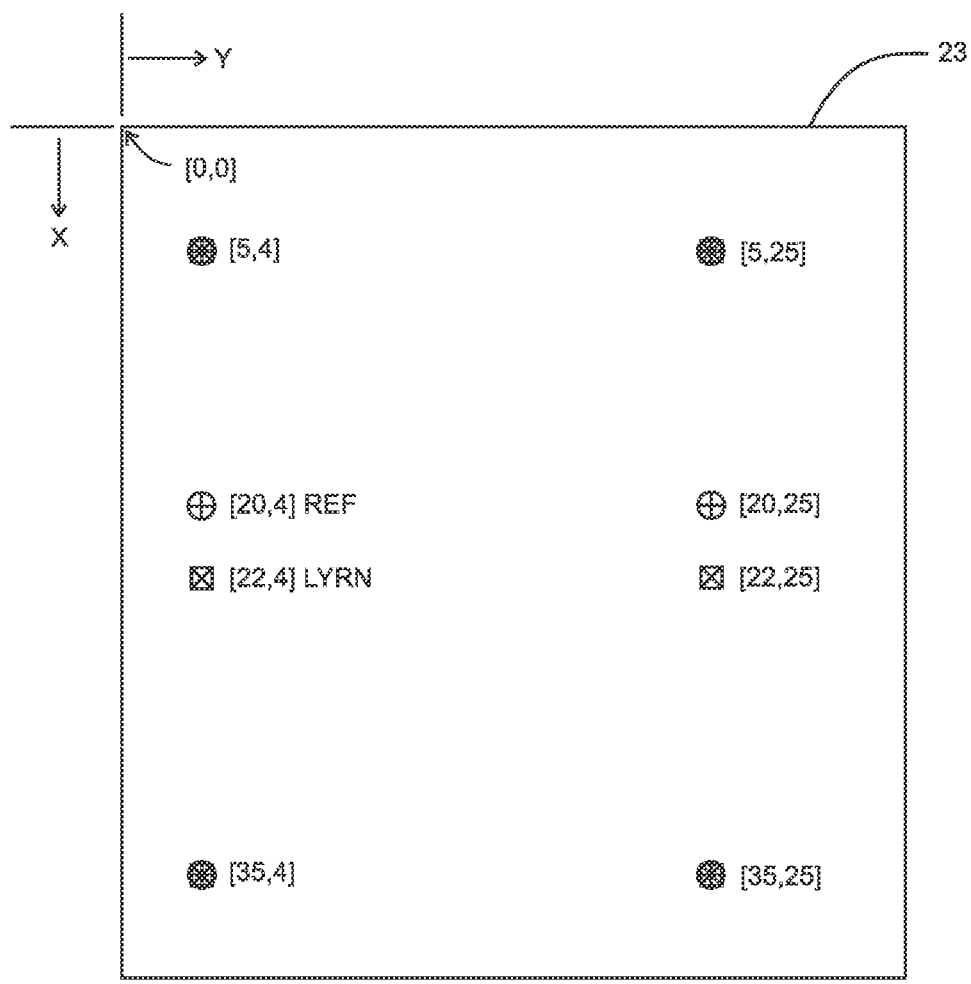
FIG. 4C is a view of overlaid fiducials from the first printing layer and the second printing layer illustrating misregistration between the layers.

FIG. 4B illustrates a fiducial for a second or subsequent layer FL2 that may be printed, for example, by a second or subsequent cylinder, such as cylinder 38. These fiducials are identified with squares and labeled FL2-1 to FL2-6. REF is layer 1 to which each subsequent layer refers. LYRN is the nth layer of the electronic device being created. Note that the fiducials FL2-1 to FL2-6 in the FIG. 4B also have corresponding matrix values as illustrated to the right of the fiducials. The matrix values for all fiducials are stored in memory by computer 32. To illustrate the layer-to-layer error between the first and second layers in the example, FIGS. 4C and 4E illustrate the superimposition of the fiducials from the FL2-1 to FL2-6 overlaid on top of the first layer fiducials FL1-1 to FL1-6. In the illustration shown, therefore, it can be seen that the fiducials of FL2-1 and FL2-4 overlay fairly accurately on fiducials FL1-1 and FL1-4. Likewise, the fiducials of FL2-3 and FL2-6 of the second layer overlay on top of the fiducials FL1-3 and FL1-6 fairly accurately. However, note a run out error between the second layer fiducials FL2-2 and FL2-5 compared to the first layer fiducials FL1-2 and FL1-5, thereby indicating a run out error that needs to be corrected otherwise the second layer will not overlay properly onto the first layer when the layers are printed on a substrate 23. This can cause significant loss and waste of substrate 23 when multiple copies of substrate 23 are improperly imprinted with the multiple layers.

FIG. 4E further illustrates the offset between layers. In FIG. 4E, a layer N could be any subsequent layer that is printed or overlaid on a preceding layer as described herein. In the illustration being described, the first layer is printed and then each and every subsequent printed layer is compared to the first layer and error correction is performed if necessary. FIG. 4E illustrates a layer N offset from the first layer. For ease of understanding, the fiducial layer variables are indicated on the map as shown. In the illustration, the value for the FL1-1 fiducial is [4,4] and the value for the FLN-1 fiducial is [5,5]. In the illustration being described, these variables for each of the fiducials on the substrate 23 are stored into memory (not shown) and are used with the equations stored herein to develop a look up table of values that will be used by the computer 32 or PLC 42 in order to correct the registration of the printing. We know both the camera position and the platen position and therefore have a map of locations. The camera simple finds the centroid or center of a desired fiducial. The values are stored in memory of control computer 32 which in-turn translates these errors into a LUT format acceptable to the multi-axis servo/PLC controller 42 such that axes motions are adjusted and synchronized to minimize the relative errors.

It should be understood that during the correction process, a plurality of substrates 23 are printed in sequential order with one layer of printing at a time. First, the first layer of printing by cylinder 16 is printed onto a plurality of substrates 23. Next, the cylinder 16 is removed from the system 10 and the next cylinder, such as cylinder 38, is rotatably mounted between the headstock 12 and tailstock 14. The registration and error correction process is then used to correct or reduce any registration errors in printing between the printings from the first layer to the second layer which is printed by the cylinder 38. A sacrificial substrate 23 is used to print the fiducials and perform the measurements necessary to effect the error correction. After the correction process, then the second layer is printed on each of the plurality of substrates 23 which already have the first layer printed thereon. Cylinder 38 is removed and the next cylinder 40 is rotatably mounted between the headstock 12 and tailstock 14. The error correction process may then be performed on a sacrificial substrate 23 having the first layer of fiducials printed thereon with the layer of printing from the next cylinder (cylinder 40 in the illustration being described). These fiducials are compared to the first layer fiducials and the error correction process described herein is applied and the registration errors or runout errors are then corrected or reduced as described herein. After the error correction process for this next layer is performed, each of the plurality of substrates 23 having the first layer and second layer printed thereon are printed with the third layer. This process repeats for each and every cylinder N and printing layer N that is to be applied to the substrate 23.

Figure 4D:
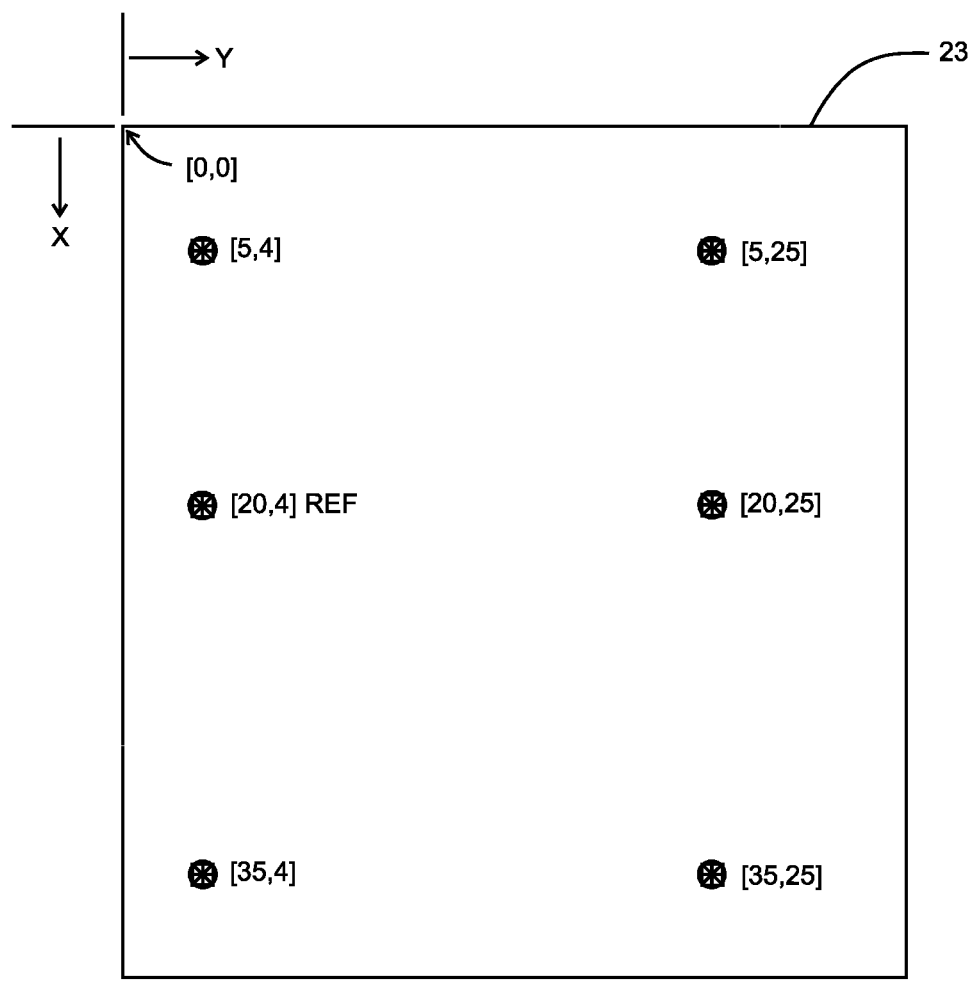
FIG. 4D is a view of the overlaid fiducials from the first printing layer and the second printing layer illustrating a perfect registration between the layers.

Finally, FIG. 4D illustrates the error correction that occurs using the system 10 and method described herein. Notice that in the illustration, the fiducials from the second layer FL2-1 to FL2-6 are overlaid in substantial registration with the fiducials of FL1-1 to FL1-6. In the illustration being described, it should be understood that while 100% error correction is always desired, it is sometimes impossible to achieve especially when overlaying multiple layers. Accordingly, some tolerance of error may be permitted and may vary from job to job.

As mentioned earlier, the user or operator may print a sacrificial substrate 23 with the first layer fiducials FL1-1 to FL1-6 and subsequently prints the second layer of fiducials FL2-1 to FL2-6 and then corrects for error between the two layers. Subsequent layers are also printed on the same substrate 23 or on a different substrate 23 having the first layer of fiducials printed thereon. Thus, in the embodiment being described, the error correction is effected one layer at a time, and each subsequent layer is compared to the first layer of fiducials for purposes or error correction. It should be understood, however, that the layers could be compared to the immediately preceding layer rather than the first layer (e.g., layer 4 fiducials are compared to layer 3 fiducials rather than layer 1 fidicisals). However, it is believed that such approach may cause a compounding or repetition of errors from preceding layers to one or more subsequent layers.

Referring now to FIG. 5, a general registration algorithm is shown. The routine starts at block 200 and system 10 is initialized by a user via computer 32 to begin a registration process. At block 202 a first cylinder, such as cylinder 16, which will print the first layer, is mounted between the headstock 12 and tailstock 14.

At block 204, one substrate 23 is mounted on the platen 22 using the pins 29a, 29b, 29c (FIG. 1). The routine continues at block 206 wherein the cylinder pointing camera or first camera 34 is utilized for course X-Y axis alignment between a starting position of the image pattern in the cylinder 16 and a starting position of the substrate 23 on platen 22 such that ink deposited or printed will occur within a course 100 micron of the feed leading edge and left substrate edge. A first sample, such as the sample shown in FIG. 4A is printed using cylinder 16 to produce a first layer print that includes, but may not be limited to the first layer fiducials FL1-1 to FL1-6 mentioned earlier (block 208). At block 210, the machine control system 30 causes the substrate or second camera 36 to image the fiducials and store the associated position values. The X-Y positions of the first layer fiducials FL1-1 to FL1-6 are stored by the control computer 32 and are later translated into the LUT of PLC 42. Again, it should be understood that these fiducial positions are used as a desired or target fiducial location for subsequent printed layers in the illustration being described. These reference positions are referred to herein as REF_LAYER_1.

The routine continues at block 212 to print a remaining batch of substrates using the cylinder 16 to produce a plurality of prints with the first layer having the first set of fiducials FL1-1 to FL1-6. Again, each subsequent substrate 23 is mounted onto the platen 22 by simply using the lower accuracy alignment pins 29a, 29b and 29c on the platen 22 surface.

At block 214, a second or subsequent cylinder (such as one of cylinders 38-41) is rotatably mounted between the headstock 12 and tailstock 14.

At block 216, one of the substrates 23, which contains the printed first layer having the first layer of fiducials FL1-1 to FL1-6, is mounted onto the platen 22 using the alignment pins 29a, 29b and 29c. At block 218, the cylinder pointing camera or first camera 34 captures and image of the cylinder 16 and creates a table of X and Y position offsets such that the circumferential (X-rotation-axis) and axial (Y-axis) start positions of cylinder #2 (38) coarsely match that of cylinder #1 (16) to an error of less than 100 microns.

Continuing to block 220, the substrate or second camera 36 captures an image of the substrate 23 to create an X axis and Y axis map of the layer 1 fiducials FL1-1 to FL1-6 for the substrate 23 that is mounted on the platen 22. This is referencing subsequent sheets of layer 1 printing back to the first layer 1 print (i.e., REF_LAYER_1). Use static X axis, Y Axis and ⊖ Axis offsets such that the position of this substrates Layer 1 fiducials most accurately matches that of REF_LAYER_1 determined in step 5. Use the static X axis, Y axis and ⊖ axis offsets such that the position of the substrate 23 first layer fiducials FL1-1 to FL1-6 most accurately match that of the REF_LAYER_1 determined at block 210.

At this point, the first cylinder 16 is removed and the second cylinder is mounted between headstock 12 and tailstock 14. Continuing to block 222, a first sample from the second or subsequent cylinder, such as cylinder 38-41, is printed. As mentioned earlier herein, note that this is a sacrificial print.

At block 224, the machine control system 30 uses the substrate or second camera 36 to store the fiducial X and Y axis positions (mentioned earlier herein and shown to the right of the fiducials FL2-1 to FL2-6 (FIG. 4B) and the second layer shown in FIG. 4B. At least one or a plurality of these fiducial layers FL2-1 to FL2-6 to be used as the desired or target fiducial locations for at least one or a plurality of subsequent printed layers. This reference position is referred to herein as REF_LAYER_2.

Next, a comparison is made at block 226 of relative errors between the first layer 1 fiducials FL1-1 to FL1-6 and the second layer 2 Fiducials FL2-1 to FL2-6. The equation is REF_DIFF_12=REF_LAYER_1−REF_LAYER_2.

REF_DIFF_12 represents the non-linear spatial differences between the geometries and mounting of the first cylinder 16 compared to second cylinder 38.

At block 228, REF_DIFF_12 is used to a dynamic motion profile for the various axes (X, Y and ⊖). Call these profiles X_DYN_12, Y_DYN_12 and THETA_DYN_12. These errors are mapped for dynamic correction on each subsequent second layer print. In other words, computer 32 uses the error map to correct for the registration error for each printing of the second layer onto the substrates 23 having the first layer during the layer-to-layer printing. The values are stored in memory of control computer 32 which in-turn translates these errors into a LUT format acceptable to the multi-axis servo/PLC controller 42 such that each axes motions (X1, X2, Y and THETA; you could also throw in XROTARY, but just keep it constant for simplicity) are adjusted and synchronized to minimize the relative errors.

At block 230, load the dynamic map profiles X_DYN_12, Y_DYN_12 and THETA_DYN_12 into the machine control system 30 as described in paragraph [0079] below.

Thereafter, a first usable substrate 23 in which the pattern from cylinder 16 is registered to the second or subsequent cylinder, such as cylinders 38-41, may be printed (block 232).

Subsequently, the remaining batch of substrates with the first and second layers are printed using the procedure shown in block 234. The remaining batch of substrates 23 are printed with the second layer using the same procedures mentioned in Blocks 216 and 220. Note that the dynamic map profiles X_DYN_12, Y_DYN_12 and THETA_DYN_12 from block 230 are still active and effect each print according to standard servo LUT controls.

The routine proceeds to block 228 where the steps 214 that print using the cylinders 32-36. After all the layers are printed, the printing is complete and the routine ends as shown.

Thus, it should be understood that each substrate is printed with each layer before any succeeding layer is printed thereon. In other words, all substrates 23 are printed with the first layer first, a sacrificial substrate 23 with first layer is used for correction and then after correction all second layers are printed onto the substrates 23 that comprise first layer. Thereafter, a third layer may be printed on a sacrificial substrate 23 having the first and second layers which is used for error correction as described herein and then all substrates 23 having the first and second layers are printed with third layer and so on.

It should be understood that static correction is a one-time alignment or correction process that facilitates removing a first order registration mark or fiducial error. The static error is expected during the initial placement of the substrate 23 on the vacuum platen 22. A sequence of calculations using the equations mentioned earlier is to correct the first order or static offset ⊖ error or error in the ⊖ axis referred to earlier herein. This error is represented by FID_LYRN_ANGLE_SINGLE. Applying this first-order ⊖ correction shifts the X and Y fiducial locations, therefore the X and Y values in array [FID_OFST_LYR1toN] must be recalculated as a result of this angle change. These X and Y fiducial location changes flow into new values for FID_OFST_LYR1toN_X_SINGLE and FID_OFST_LYR1toN_Y_SINGLE. Applying these X and Y offsets now completes the static alignment process. This static alignment facilitates minimizing the loading error of a given substrate to that of REF_LAYER_1.

Note that the energizable mechanism for static correction are the first and second drive motors 64 and 66 which drive the platen 22 in the X-axis (47) direction and ⊖ axis (96) direction. To accomplish simple X-axis motion, the first and second drive motors 64 and 66 are at the same relative position and then energized by PLC 42 and driven at the same speed. To accomplish ⊖ or Yaw motion of the platen 22, the first and second drive motors 64 and 66 are positionally offset to create rotary motion using the cruciform 200 shown in FIG. 3. Additionally, a drive motor 68 drives the platen 22 in the Y (52) direction. Another axis of control, namely the $X_{rotary}$ axis (50), is accomplished using cylinder motor 74, which controls cylinder 16 rotation.

An additional mechanism of static Y axis control is the thermal growth/contraction of the cylinder 16 using the Environmental Control System 106.

Once minimizing the layer-to-layer fiducial placement error via static correction means has been completed, a dynamic correction process is needed. During this process, the various axes are synchronized and can be shifted relative to each other. This allows or enables automatic, electronic correction to compensate beyond the base accuracy of the mechanics. As already stated, the aforementioned equations used to perform a static alignment in the X, Y and ⊖ axis are also used for dynamic compensation of errors. As mentioned earlier, correction in sub-areas of the substrate 23 may be performed, namely, the following steps must be performed:

Use the [FID_LYRN_ANGLE_SINGLE], [FID_OFST_LYR1toN_X_SINGLE] and [FID_OFST_LYR1toN_Y_SINGLE] corrections described above under the static correction section to recalculate the fiducial arrays [FID_OFST_LYR1toN] for the X and Y axis and [FID_LYRN_ANGLE] for the ⊖ axis. These represent the errors which must be dynamically corrected.

Thus, it should be understood that a servo-system correction table or LUT for each axis (X, Y and ⊖) is created by using the following:

A. Advance servo systems and PLC 42 have motion profiles to alter the motion of the platen 22 and/or cylinder 16 in any particular X, Y or ⊖ axis. These profiles are loaded into the PLC 42 or by computer 32. Typically, the format is a space delimited ASCII text file, but the manufacturer of the PLC 42 will usually provide a detailed specification of the format for their particular motor.

B. The servo system correction table has a much higher number of data points than the number of fiducials. Therefore, the servo system correction table or dynamic map profiles are created through interpolating between the fiducial point errors for each of the motors associated with each motion axis and LUT.

C. Since the correction can take place in a fraction of the length of the X axis, the errors must be calculated in multiple 'bands' along the X axis which reside between fiducials. Note that a LUT is created for each layer-to-layer comparison and registration.

An example resulting dynamic map profiles between layer 1 of cylinder 16 and layer 2 of a subsequent cylinder 38 is shown in FIGS. 4A-4D. The corresponding calculation of X_DYN_12, THETA_DYN_12 and Y_DYN_12 of FIG. 3 is determined by iteratively using the using the [FID_LYRN_ANGLE_SINGLE], [FID_OFST_LYR1toN_X_SINGLE] and [FID_OFST_LYR1toN_Y_SINGLE] arrays defined above in an iterative process to minimize the resulting errors.

In order to effect dynamic correction, platen motors 64 and 66 drive the platen 22 in both the X and ⊖ directions.

Figure 5A:
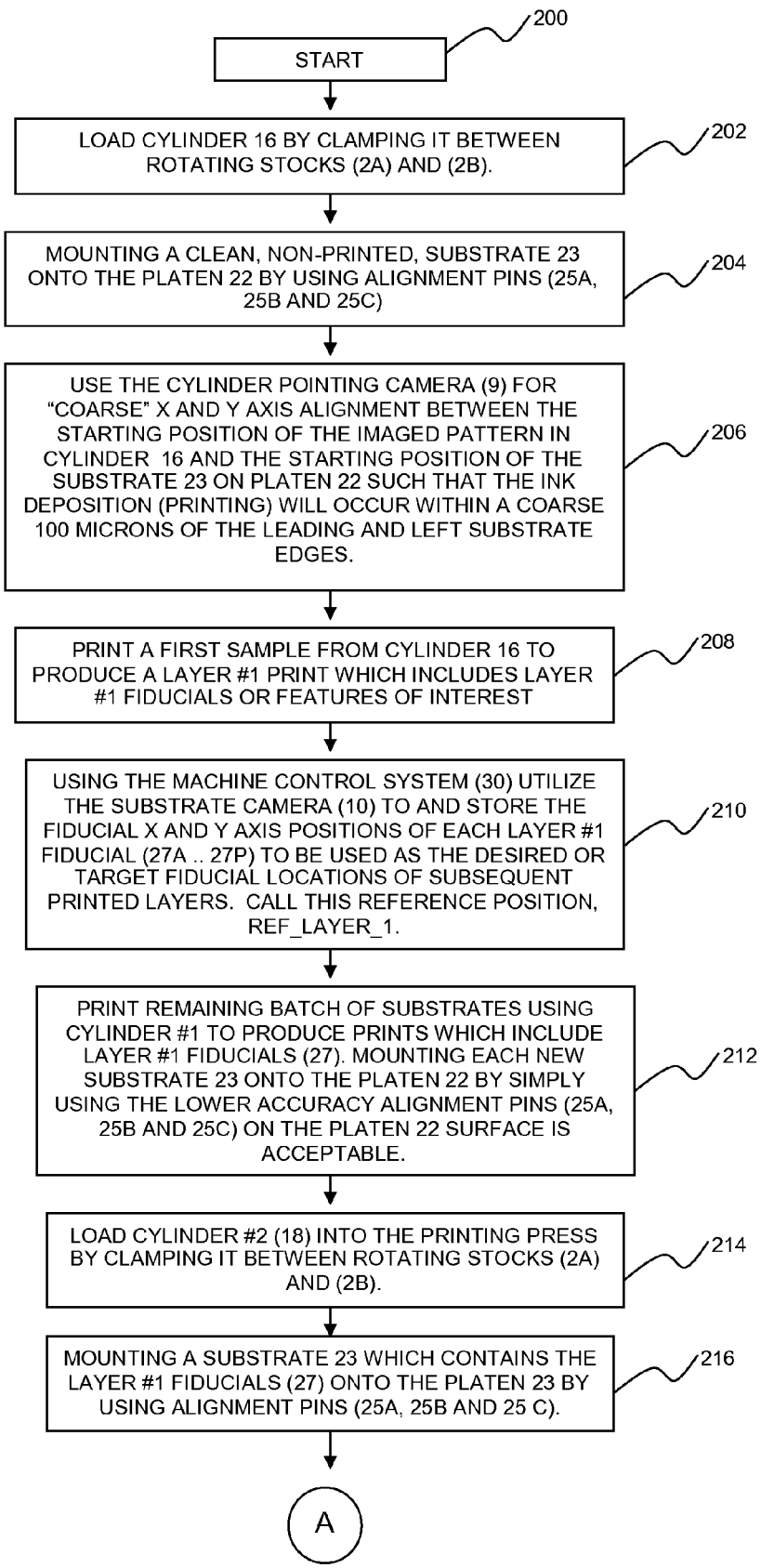
FIGS. 5A-5C are a schematic diagram of a method or process in accordance with one embodiment of the invention.
Figure 5B:
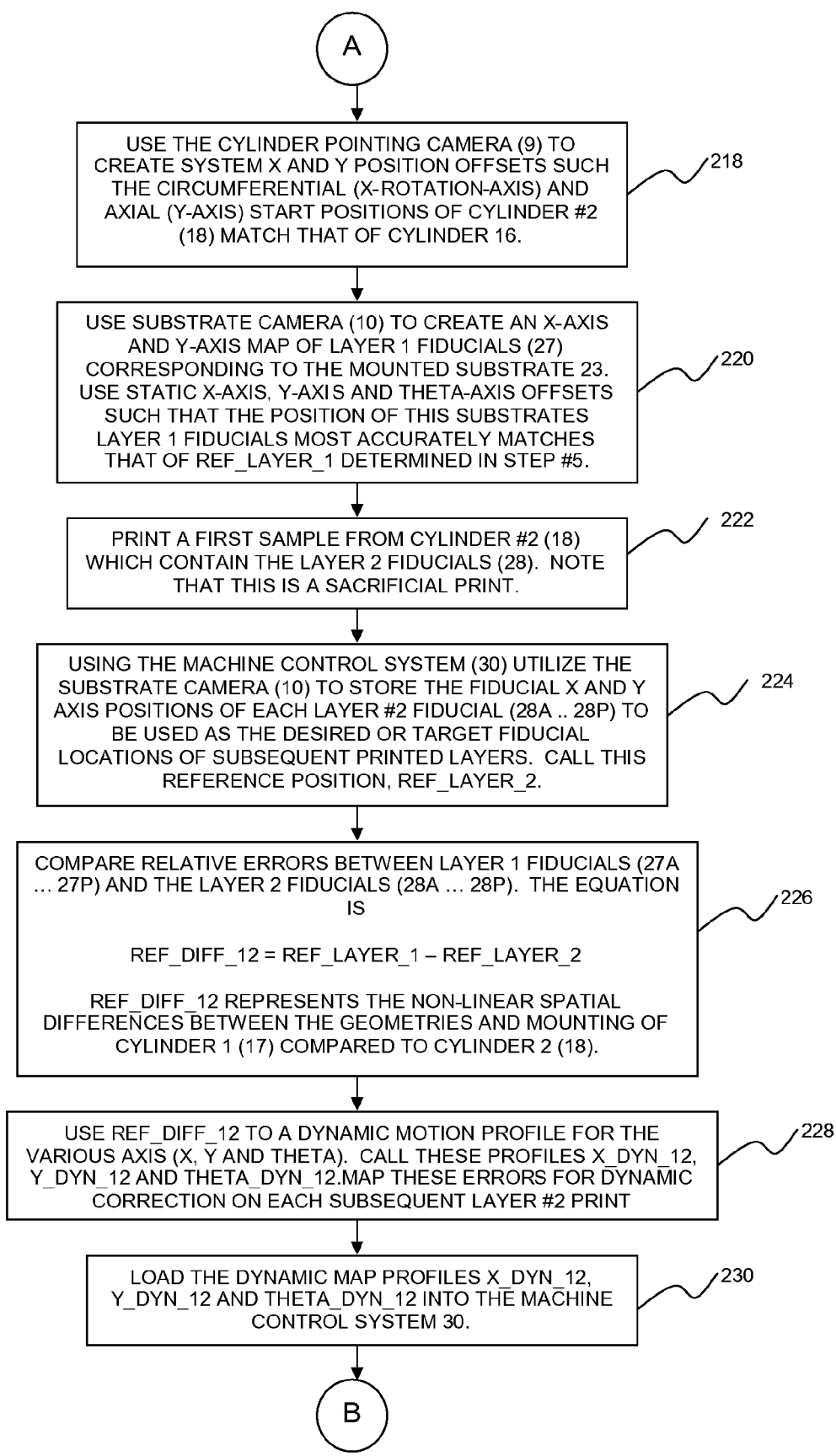
Figure 5C:
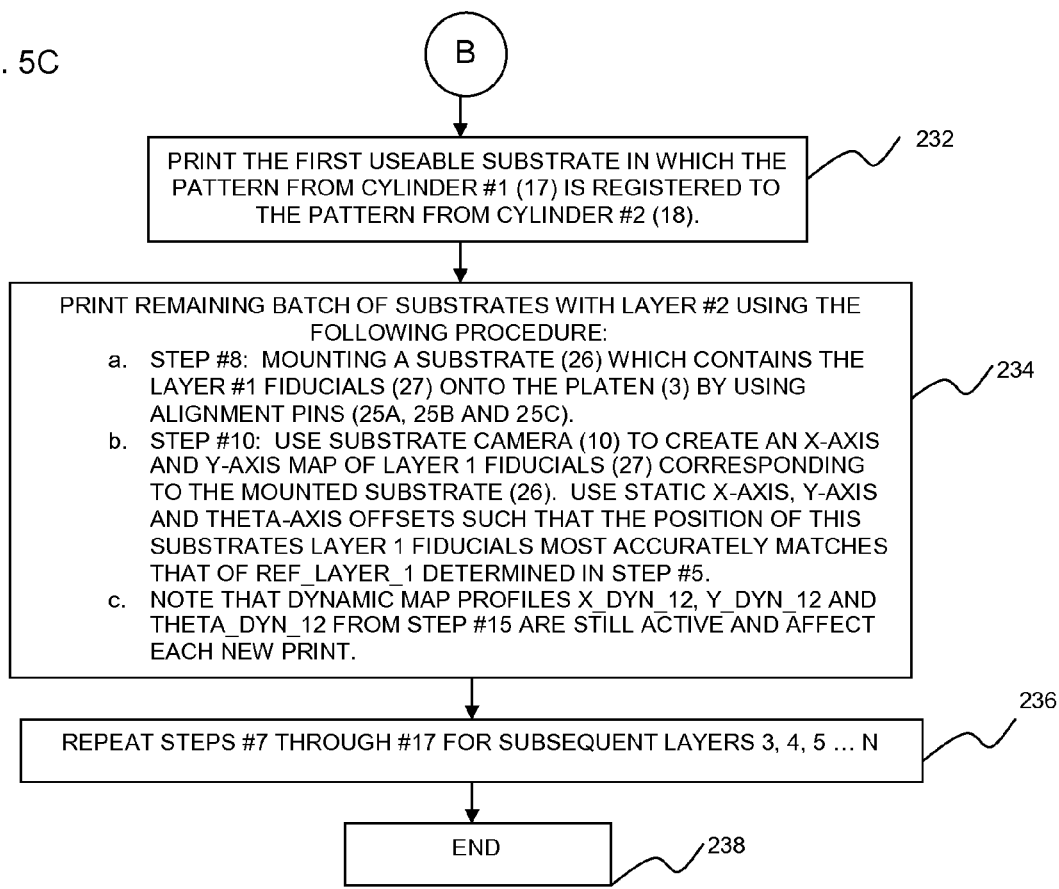

An example of dynamic correction to correct for two cylinders with slightly different circumferences is to drive the platen 22 via motors 64 and 66 at a different rate than that of $X_{ROTARY}$ axis through the use of dynamic map profiles as described in the FIGS. 5A-5C example. Similarly, platen 22 drivers 64 and 66 can be driven synchronously to the other axis to accomplish the desired overlay of fiducials (i.e., correction).

The correction bandwidth of each axis is approximately 400 Hz in this embodiment of the invention. The computer 32 creates the dynamic map profiles to be loaded into the LUT for use by the multi-axis servo controller PLC 42. Using a typical print velocity of 1.0 meters per second, this bandwidth corresponds to 120 corrections over a typical 300 mm substrate. Note that higher bandwidth methods can be achieved through alternate actuation structures such as the following list: piezo-electric devices, magnetostriction devices, voice coil devices and electro-mechanical devices.

Additionally, the desired nip force (compression force between the printing cylinder 16 and the substrate 23) must be considered when sizing the printing motors (64, 66, 68, 74 and 76). Each motor must be sized to provide the required acceleration of the composite component or part that it drives and as may be necessary to overcome the nip force for slip forces.

This system or method could include alone or in combination one or more of the following features:
- method of determining/characterizing and ultimately correcting (multi-axis) positional error between successive layers of printing; and
- the above on a direct gravure press.
- performing corrections through the manipulation/adjustment of up to four (4) axes:
  - X;
  - Y;
  - Z (Nip force determination); and
  - Theta.
- corrections in the above axis include both static elongation/compression and dynamic correction which occur numerous times within a single printed substrate;
- motion (printing) actuation systems include:
  - linear motors with servo;
  - ball screw with servo;
  - piezo devices;
  - magnetostrictive devices;
  - voice coil devices; and
  - electro-mechanical devices.
- control of cylinder length errors through thermal expansion and contraction;
- bearing systems include:
  - mechanical bearings;
  - pneumatic bearings; and
  - hydrostatic bearings.
- the mapping of millimeter-by-millimeter correction includes of the following methods:
  - linear motor mapping; and
  - look-up table prom as in U.S. Pat. No. 5,329,215.
  - characterization system tools include the accurate positioning and:
  - compound microscope(s); and
  - telecentric microscope(s).
- a direct gravure printer for depositing a patterns on a substrate comprising:
  - a printing bed.
- an automated method to perform the above.
- the invention may be applicable and used with gravure printing, flexographic printing, offset printing and gravure offset printing.

While the method, system and apparatus described herein, constitute preferred embodiments of this invention, it is to be understood that the invention is not limited to this precise method, system and apparatus, and that changes may be made in either without departing from the scope of the invention, which is defined in the appended claims.

What is claimed is:

1. A printing system for printing a plurality of printed layers onto a substrate, said printing system comprising:
   a bed having a headstock and tailstock, said headstock and said tailstock rotatably receiving and supporting at least one of a plurality of cylinders at a printing station, said plurality of cylinders corresponding to said plurality of printed layers, respectively;
   a platen adapted to receive the substrate;
   a plurality of drivers for driving at least one of said plurality of cylinders or said platen in a plurality of axes to effect layer-to-layer registration of the plurality of printed layers on the substrate;
   at least one camera for measuring a position of a plurality of fiducials associated with each of said plurality of printed layers of printing; and
   a control system for receiving said measurements of said positions of said plurality of fiducials and for correcting for positional errors between successive layers of said plurality of printed layers of printing by energizing at least one of said plurality of drivers to drive said at least one of said plurality of cylinders or said platen in at least one of said plurality of axes;
   wherein each of said plurality of cylinders prints at least one of said plurality of printed layers onto the substrate, said control system being adapted to determine a layer-to-layer registration relationship between at least two of said plurality of printed layers and for correcting said positional errors as said successive layers of said plurality of printed layers are printed on the substrate and wherein all of said successive layers of said plurality of printed layers are printed on the same substrate.

2. The printing system as recited in claim 1 wherein said plurality of axes include at least X, Y and Theta,
   said control system energizing said plurality of drivers for driving said platen in said at least X, Y and Theta axes, said Theta axis being associated with a yaw of said platen.

3. The printing system as recited in claim 1 wherein said plurality of axes include a Z axis associated with a nip force between said platen and said cylinder.

4. The printing system as recited in claim 3 wherein said printing system comprises a drive motor for driving each of said plurality of cylinders toward and away from said platen in order to change said nip force.

5. The printing system as recited in claim 1 wherein said system further comprises an environmental control system coupled to said at least one of said plurality of cylinders for controlling a temperature of said at least one of said plurality of cylinders in order to change primarily an axial dimension of said at least one of said plurality of cylinders.

6. The printing system as recited in claim 1 wherein said correction of said positional errors is performed statically before a layer of printing is applied to the substrate.

7. The printing system as recited in claim 1 wherein said correction of said positional errors is performed dynamically while a layer of printing is printed on the substrate.

8. The printing system as recited in claim 6 wherein said correction of said positional errors is performed dynamically while a layer of printing is printed on the substrate and after said static correction.

9. The printing system as recited in claim 1 wherein said control system energizes at least one of said plurality of drivers to cause said plurality of cylinders to either slip or drag relative to said platen while a layer of printing is being applied to the substrate.

10. The printing system as recited in claim 2 wherein said control system energizes at least one of said plurality of drivers to cause relative slippage or drag between said at least one of said plurality of cylinders and said platen while a layer of printing is applied to the substrate.

11. The printing system as recited in claim 1 wherein at least one of said plurality of drivers is energized by said control system to cause Theta or yaw movement of said platen.

12. The printing system as recited in claim 11 wherein said plurality of drivers comprises a first linear drive motor and a second linear drive motor coupled to said platen;
said control system energizing said first and second linear drive motors such that they cause yaw movement of said platen either prior to printing or during printing of at least one of said plurality of layers.

13. The printing system as recited in claim 1 wherein said plurality of drivers are energized by said control system to cause movement of said platen in a plurality of said X, Y or Theta axis either prior to printing or during printing of at least one of said plurality of layers.

14. The printing system as recited in claim 1 wherein said system comprises at least one flexible support for supporting said platen, said at least one flexible support being adapted to permit said Theta or yaw movement of said platen relative to said bed while said platen is being driven along said bed and past said at least one of said plurality of cylinders.

15. The printing system as recited in claim 14 wherein said at least one flexible support comprises a plurality of springs for biasing said platen in a home position relative to said bed and for permitting said yaw movement of said platen during printing.

16. The printing system as recited in claim 1 wherein said plurality of fiducials comprises a first or reference set of fiducials associated with a first or reference layer of printing and a second or subsequent set of fiducials associated with a second or subsequent layer of printing, said control system further comprising:
a fiducial map profile generator for generating a fiducial map profile using said first or reference set of fiducials and said second or reference set of fiducials associated with a second one of said plurality of cylinders;
said control system energizing said plurality of drivers in response to said fiducial map profile in order to reduce or eliminate at least one of said positional errors.

17. A method for facilitating minimizing errors in layer-to-layer registration of multiple printing layers using the printing system as recited in claim 1, wherein said plurality of cylinders comprises a first cylinder and at least one subsequent cylinder, said method comprising the steps of:
mounting the substrate on said platen;
printing a first or reference layer on the substrate using the first cylinder during relative movement between the first cylinder and said platen;
printing at least one second or subsequent layer on the substrate using the at least one subsequent cylinder during relative movement between the at least one subsequent cylinder and said platen;
analyzing said substrate and determining at least one error between said first or reference layer and said second or subsequent layer;
driving at least one of said first cylinder or said platen in a plurality of axes in response to said at least one error in order to eliminate or reduce said at least one error.

18. The method as recited in claim 17 wherein said method further comprising the step of:
printing a plurality of substrates with said first or reference layer to provide a plurality of first layer substrates;
using one of said plurality of substrates having said first or reference layer printed thereon as a sacrificial substrate from which said analyzing step is performed;
printing a plurality of said plurality of first or reference layer substrates with said at least one second or subsequent layer to provide a plurality of references and subsequent layer substrates with said at least one error being eliminated or reduced.

19. The method as recited in claim 18 wherein said method further comprising the step of:
performing said driving step statically and before said printing of said plurality of reference and subsequent layer substrates.

20. The method as recited in claim 18 wherein said method further comprising the step of:
performing said driving step dynamically during said printing of said plurality of reference and subsequent layer substrates.

21. The method as recited in claim 18 wherein said method further comprising the step of:
performing said driving step both statically before said printing of said plurality of reference and subsequent layer substrates and dynamically during said printing of said plurality of reference and subsequent layer substrates.

22. The method as recited in claim 18 wherein said driving step comprises the step of:
driving at least one of said cylinder or said platen in a plurality of axes that include at least an X, Y and Theta.

23. The method as recited in claim 22 wherein said driving step comprises the step of:
energizing a first plurality of drivers to drive said platen in at least one of said X, Y and Theta axes, said Theta axis being associated with said platen.

24. The method as recited in claim 23 wherein said platen is driven in said Theta axis to correct for said at least one error.

25. The method as recited in claim 24 wherein said platen is driven in said Theta axis during printing of at least one subsequent layer on a plurality of substrates comprising said first or reference layer.

26. The method as recited in claim 18 wherein said plurality of axes further include a Z axis associated with a nip force between said platen and said cylinder.

27. The method as recited in claim 26 wherein said method further comprises the step of:
driving said cylinder toward and away from said platen in order to change said nip force.

28. The method as recited in claim 26 wherein said method further comprises the step of:
controlling a temperature of said cylinder in order to change primarily an axial dimension of said cylinder in response to an error.

29. The method as recited in claim 17 wherein said correction of said at least one error is performed statically before a layer of printing is applied to the substrate.

30. The method as recited in claim 17 wherein said driving step is performed dynamically while at least one subsequent layer of printing is being printed on the substrate.

31. The method as recited in claim 29 wherein said driving step is performed dynamically while at least one subsequent layer of printing is printed on the substrate and after said static correction.

32. The method as recited in claim 17 wherein said method further comprises the step of:
  causing at least one of slip or drag between said cylinder and said platen while at least one subsequent layer of printing is being applied to the substrate.

33. The method as recited in claim 17 wherein said method further comprises the step of:
  energizing at least one of a plurality of drivers to cause movement of said platen in at least one of an X axis, Y axis or Theta axis.

34. The method as recited in claim 33 wherein said plurality of drivers comprises a first linear drive motor and a second linear drive motor coupled to said platen, said method comprising the step of:
  energizing said first and second linear drive motors such that they cause yaw movement of said platen either prior to printing or during printing of at least one subsequent layer.

35. The method as recited in claim 33 wherein said method further comprises the step of:
  causing movement of said platen in a plurality of said X, Y or Theta axis either prior to printing or during printing of at least one subsequent layer.

36. The method as recited in claim 17 wherein said method further comprises the step of
  causing movement of said platen in at least one of an X axis, Y axis or Theta axis relative to a bed during printing and while said platen is being driven across said bed and past said cylinder.

37. The method as recited in claim 36 wherein said method further comprises the step of:
  using at least one flexible support comprising a plurality of springs to support said platen, said at least one flexible support biasing said platen in a home position relative to said bed and permitting said yaw movement of said platen when said platen is moved during printing.

38. The method as recited in claim 17 wherein said method further comprises the step of:
  printing a first or reference set of fiducials as said reference layer and another or subsequent set of fiducials as at least one subsequent layer;
  using said reference and subsequent sets of fiducials to determine said at least one error.

39. The method as recited in claim 38 wherein said method further comprises the step of:
  analyzing locations between corresponding fiducials in said first or reference and subsequent sets of fiducials and determining whether said at least one error exists in any of an X axis, a Y axis and a Theta axis and creating a motion profile in response thereto;
  using said motion profile to drive said platen in any or all of said X, Y and Theta axes to correct for any of said at least one error.

40. The method as recited in claim 38 wherein said method further comprises the step of:
  comparing said first or reference set of fiducials from said first or reference layer to corresponding or subsequent fiducials in said additional sets of fiducials from said at least one subsequent layer during said analyzing step.

41. The method as recited in claim 40 wherein said at least one subsequent layer comprises a plurality of subsequent layers, said method further comprising the step of:
  comparing a plurality of sets of fiducials from each of said plurality of subsequent layers, respectively, to said first or reference set of fiducials from said first or reference layer during said analyzing step.

42. The method as recited in claim 33 wherein said plurality of drivers comprises a first linear drive motor and a second linear drive motor coupled to said platen, said method comprising the step of:
  energizing at least one of said plurality of drivers to cause X axis movement of said platen either prior to printing or during printing of at least one subsequent layer, wherein said X axis movement is generally in a direction of movement of said platen.

43. The method as recited in claim 42 wherein said method further comprises the step of:
  causing movement of said platen in a plurality of said X axis during printing of said at least one subsequent layer.

44. The method as recited in claim 33 wherein said plurality of drivers comprises a first linear drive motor and a second linear drive motor coupled to said platen, said method comprising the step of:
  energizing at least one of said plurality of drivers to cause Y axis movement of said platen either prior to printing or during printing of at least one subsequent layer, wherein said Y axis movement is generally transverse in a direction of movement of said platen.

45. The method as recited in claim 44 wherein said method further comprises the step of:
  causing movement of said platen in a plurality of said Y axis during printing of said at least one subsequent layer.

46. The printing system as recited in claim 1 wherein said plurality of cylinders are each engraved cylinders.

* * * * *

UNITED STATES PATENT AND TRADEMARK OFFICE
CERTIFICATE OF CORRECTION

PATENT NO. : 8,863,661 B2  
APPLICATION NO. : 13/046145  
DATED : October 21, 2014  
INVENTOR(S) : Fraser et al.

It is certified that error appears in the above-identified patent and that said Letters Patent is hereby corrected as shown below:

In the specification

Column 14, line 63-64, delete "$FID\_LYRN\_THETAm = ATAN\left(\dfrac{FID\_LYRN\_RCTR\_Ym}{FID\_LYRN\_RCTR\_XM}\right)$"

and insert -- $FID\_LYRN\_THETAm = ATAN\left(\dfrac{FID\_LYRN\_RCTR\_Ym}{FID\_LYRN\_RCTR\_Xm}\right)$ -- therefor Signed and Sealed this  
Twenty-fourth Day of November, 2015

Michelle K. Lee  
*Director of the United States Patent and Trademark Office*